(12) United States Patent
Denda et al.

(10) Patent No.: US 7,567,309 B2
(45) Date of Patent: Jul. 28, 2009

(54) PIXEL ELECTRODES AND SWITCHING ELEMENTS FORMED ON SAME SUBSTRATE IN OPENINGS OF INSULATING FILM FORMED ON THE SUBSTRATE

(75) Inventors: Atushi Denda, Chino (JP); Yoichi Noda, Fujimi (JP)

(73) Assignee: Seiko Epson Corporation (JP)

( * ) Notice: Subject to any disclaimer, the term of this patent is extended or adjusted under 35 U.S.C. 154(b) by 461 days.

(21) Appl. No.: 11/365,891

(22) Filed: Feb. 28, 2006

(65) Prior Publication Data
US 2006/0202202 A1 Sep. 14, 2006

(30) Foreign Application Priority Data
Mar. 9, 2005 (JP) .............................. 2005-064988

(51) Int. Cl.
*G02F 1/136* (2006.01)
(52) U.S. Cl. ........................... 349/43; 349/38; 349/138; 349/143
(58) Field of Classification Search ................... 349/38, 349/43, 138, 143
See application file for complete search history.

(56) References Cited

U.S. PATENT DOCUMENTS

| | | | |
|---|---|---|---|
| 4,889,411 A * | 12/1989 | Parks et al. .................... | 349/43 |
| 5,930,607 A | 7/1999 | Satou | |
| 6,838,696 B2 | 1/2005 | Kobayashi et al. | |
| 7,084,017 B2 | 8/2006 | Nakamura et al. | |
| 7,136,127 B2 | 11/2006 | Furusawa | |
| 7,394,097 B2 | 7/2008 | Kobayashi et al. | |
| 2002/0018176 A1 | 2/2002 | Kobayashi et al. | |
| 2005/0003640 A1 | 1/2005 | Ushiyama et al. | |
| 2008/0231770 A1 | 9/2008 | Kobayashi et al. | |
| 2008/0241980 A1 | 10/2008 | Kobayashi et al. | |

FOREIGN PATENT DOCUMENTS

| | | |
|---|---|---|
| EP | 1 478 016 A2 | 11/2004 |
| EP | 1 630 869 A2 | 3/2006 |
| JP | 02-170135 | 6/1990 |
| JP | 06-095147 | 4/1994 |
| JP | 2001-339072 | 12/2001 |
| JP | 3261699 | 12/2001 |
| JP | 2002-090776 | 3/2002 |
| JP | 2003-318131 | 11/2003 |

OTHER PUBLICATIONS

Communication from European Patent Office regarding related application.
Patent Abstracts of Japan for Japanese Publication No. 09061835 dated Mar. 7, 1997.

* cited by examiner

*Primary Examiner*—David Nelms
*Assistant Examiner*—John Heyman
(74) *Attorney, Agent, or Firm*—Harness, Dickey & Pierce, P.L.C.

(57) ABSTRACT

A pixel structure includes pixel electrodes and switching elements which correspond to the pixel electrodes. The pixel electrodes and the switching elements are formed on the same substrate, and each pixel electrode is provided in a layer on the substrate, not on a semiconductor layer of the switching element.

15 Claims, 16 Drawing Sheets

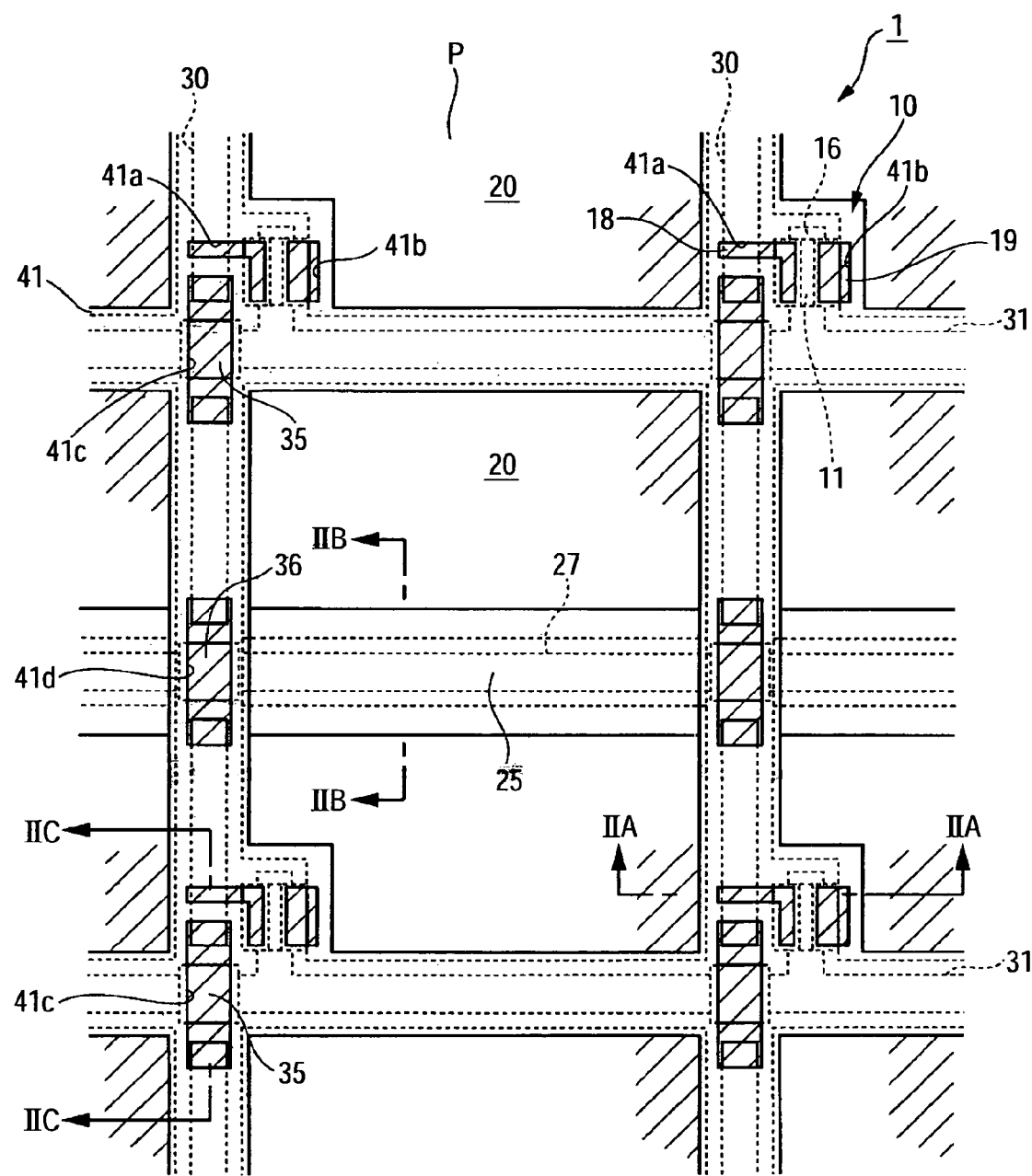

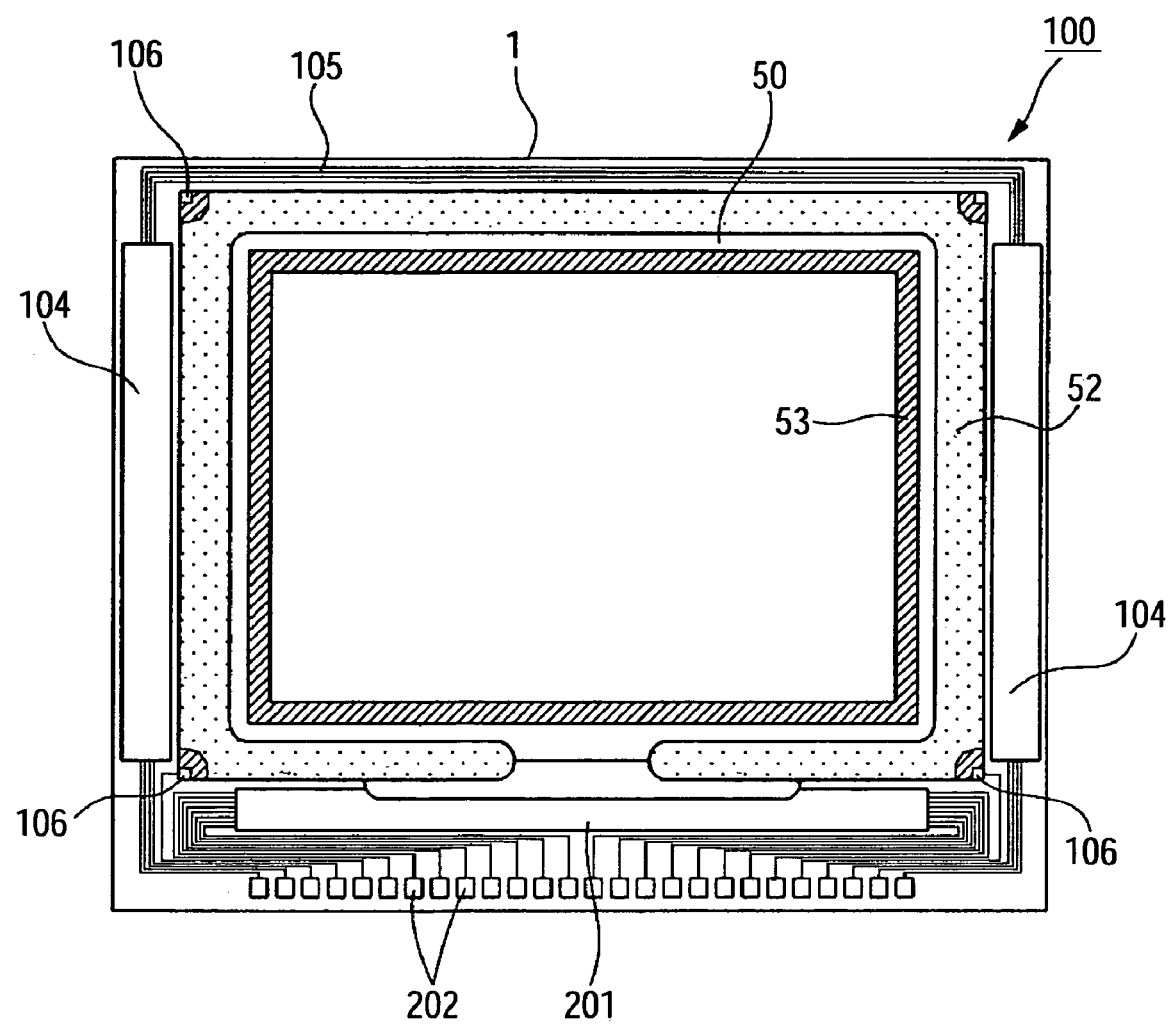

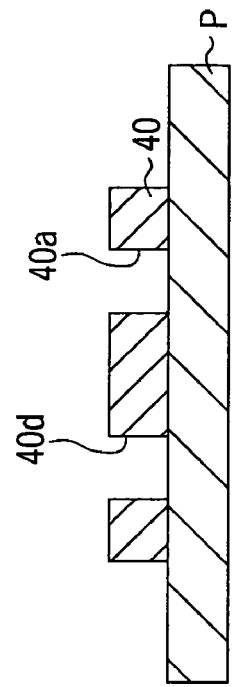
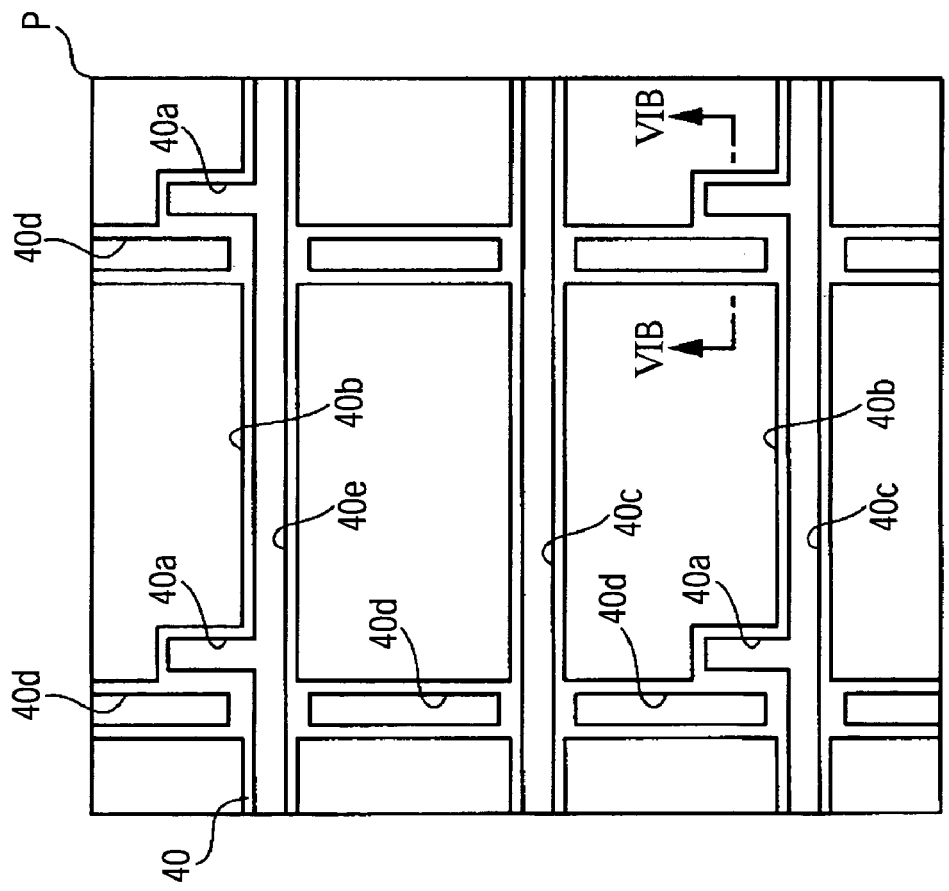

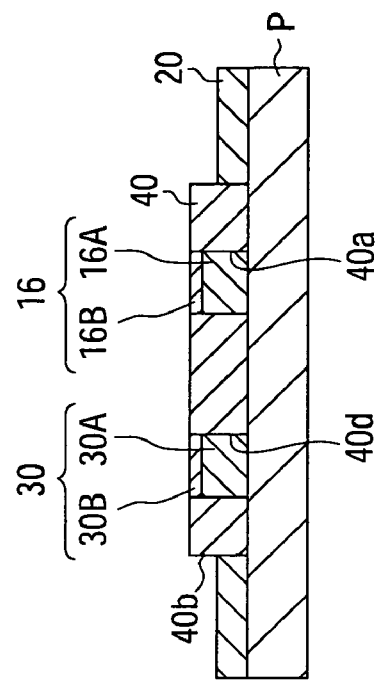
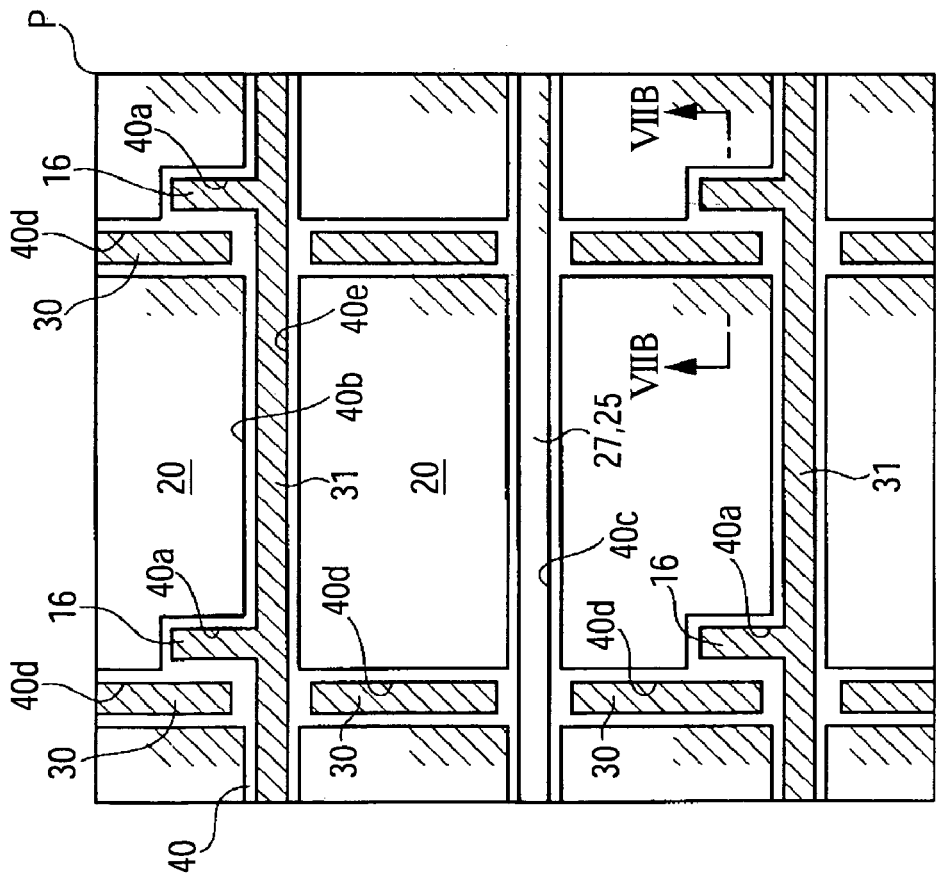

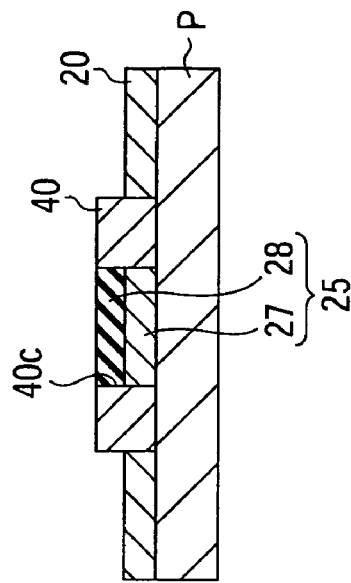
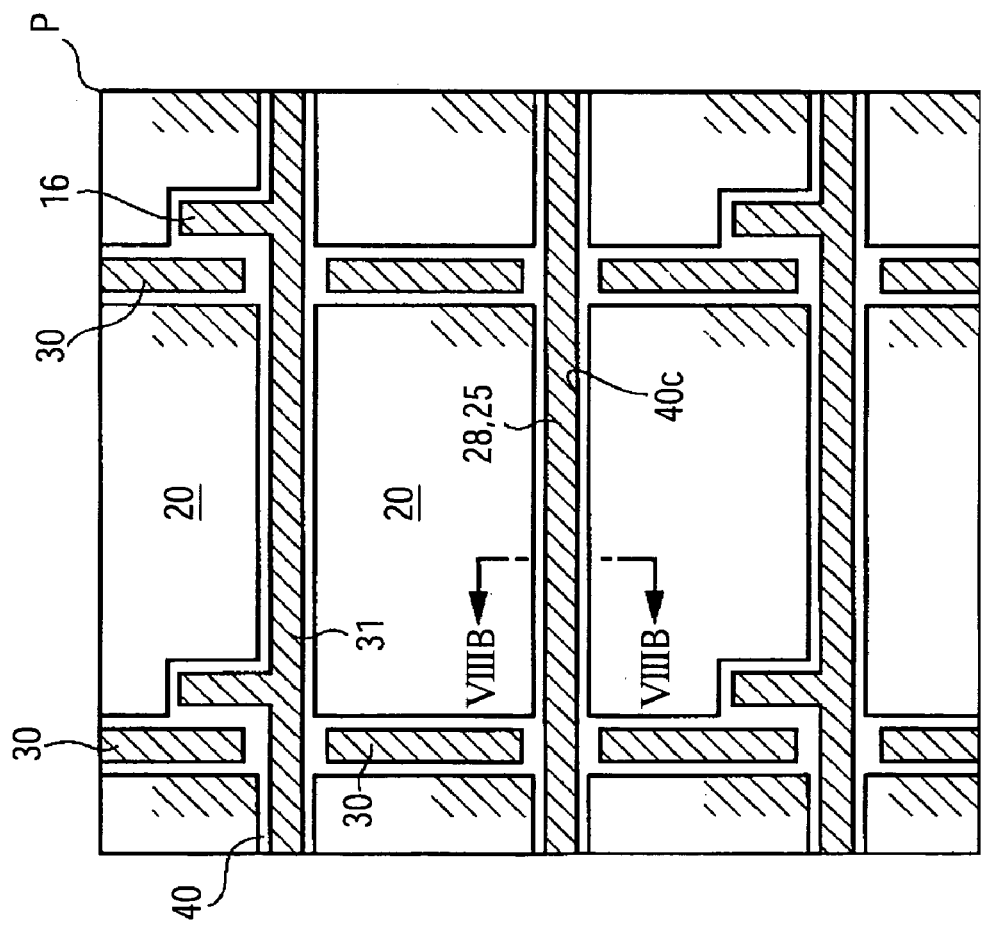
FIG. 8B
FIG. 8A

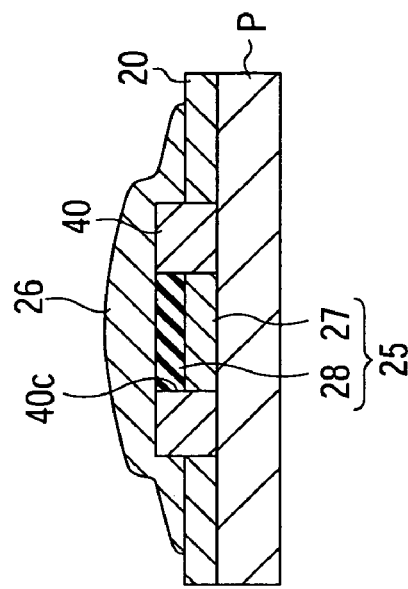
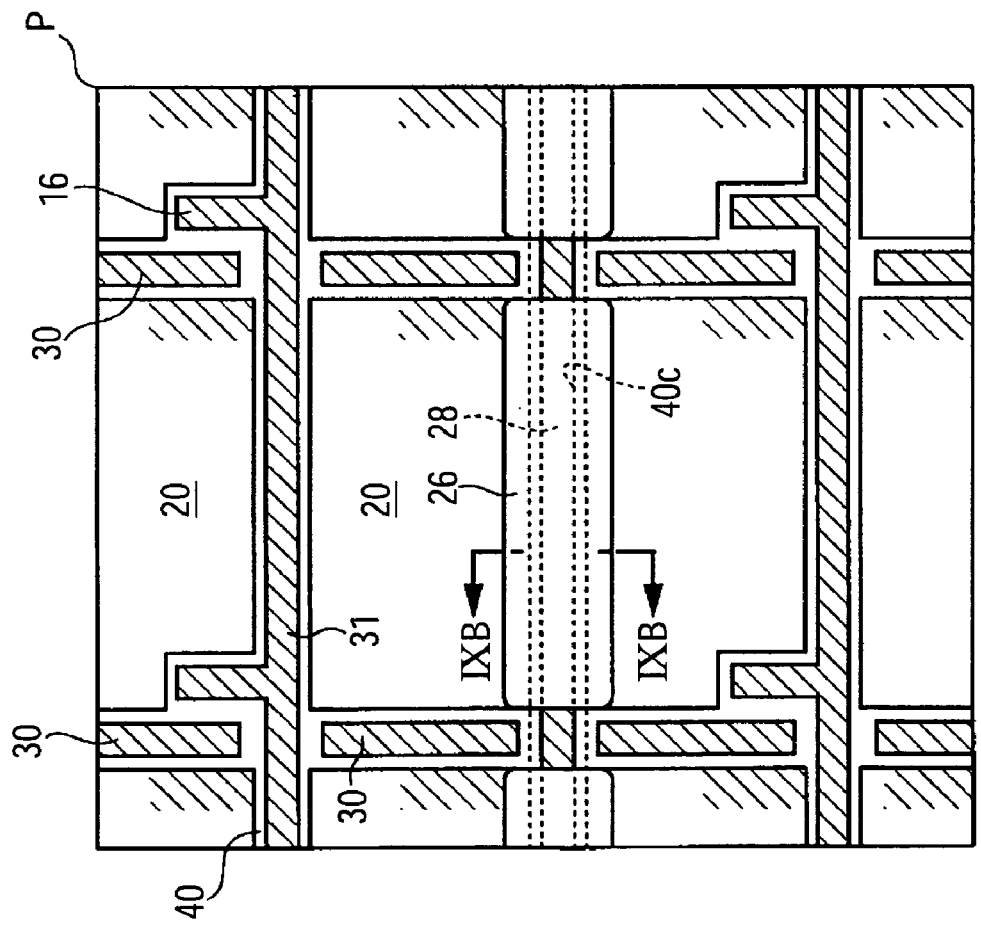

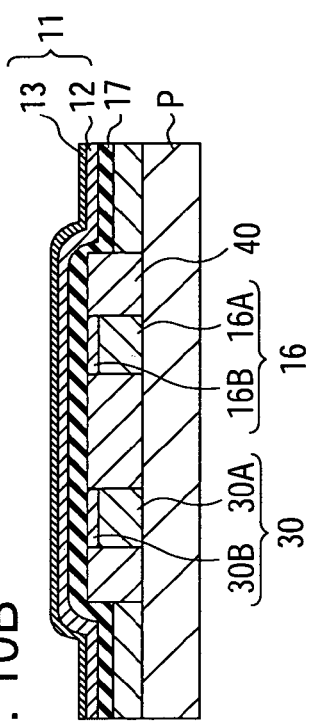
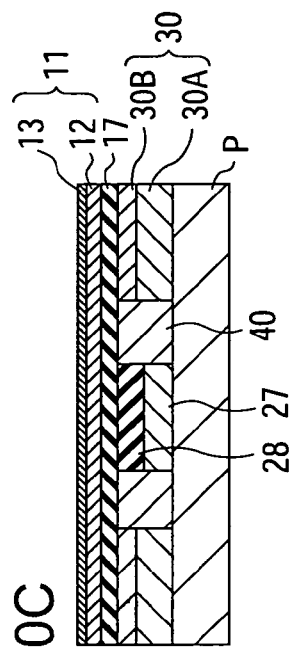
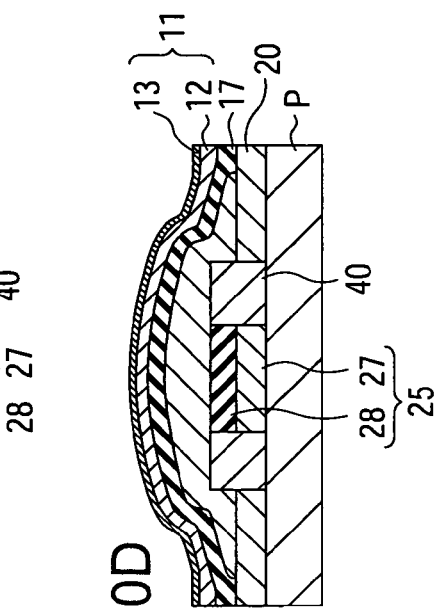
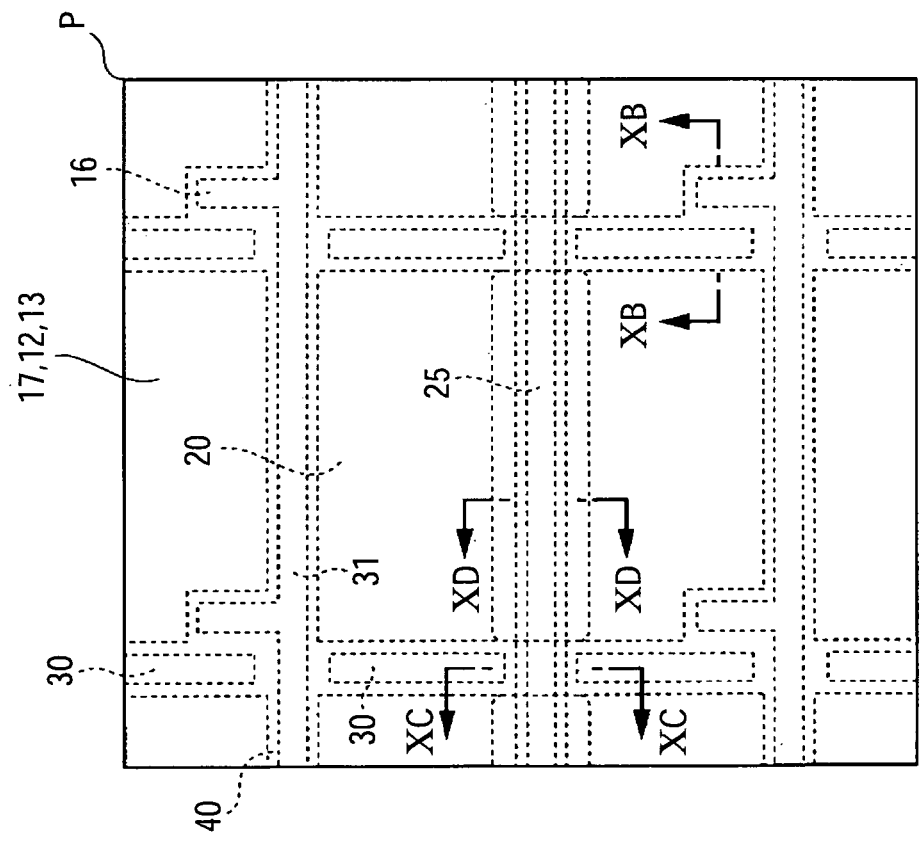

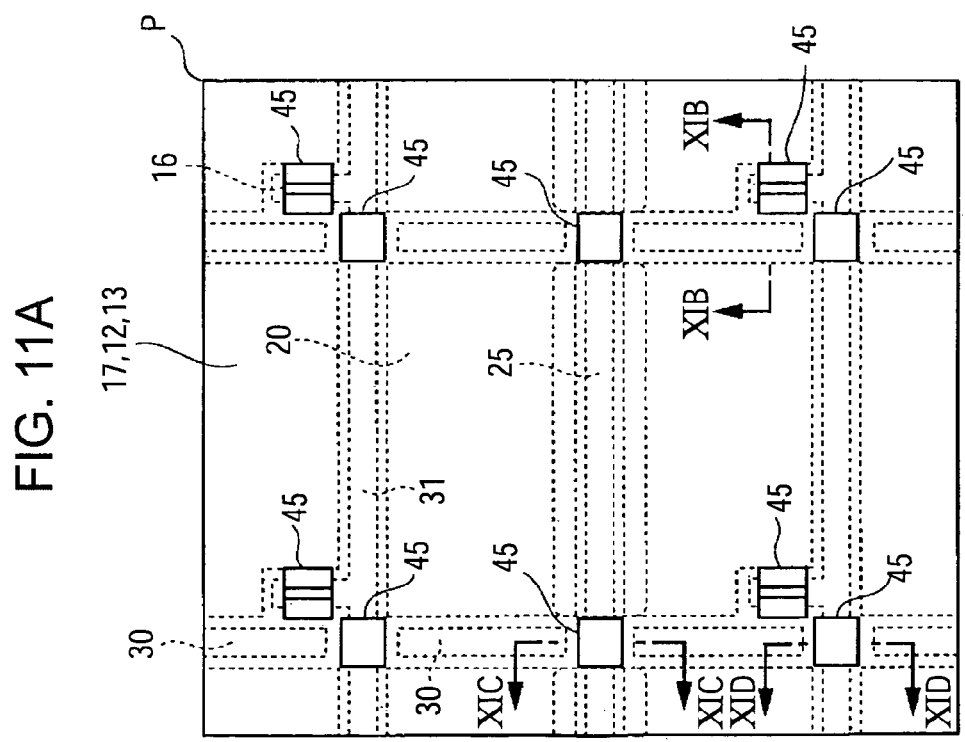
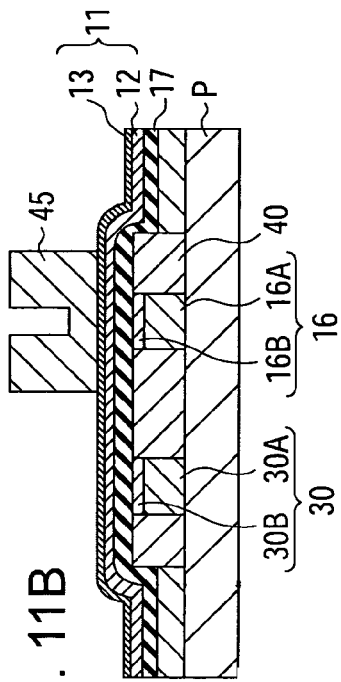
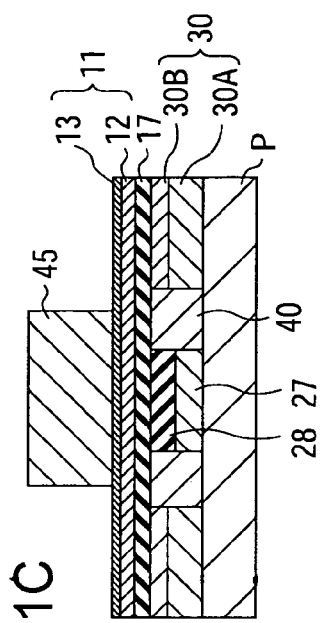
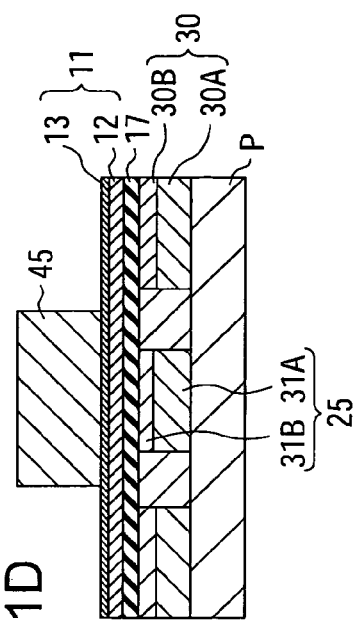
FIG. 11A
FIG. 11B
FIG. 11C
FIG. 11D

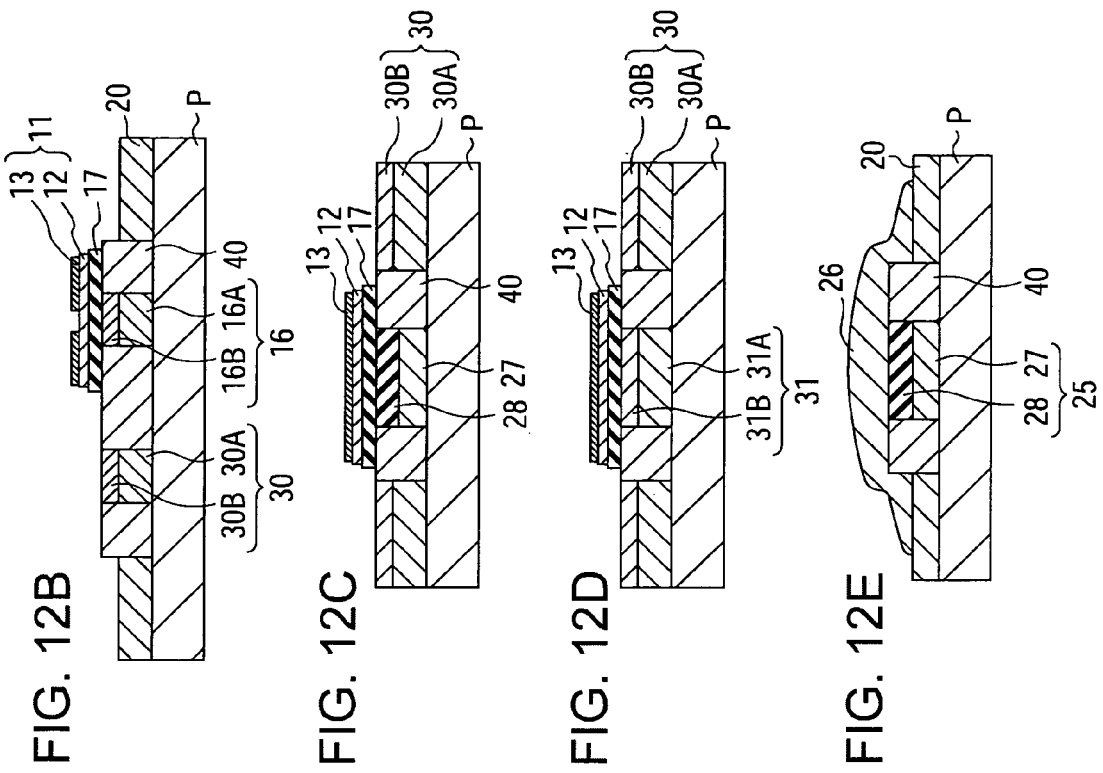
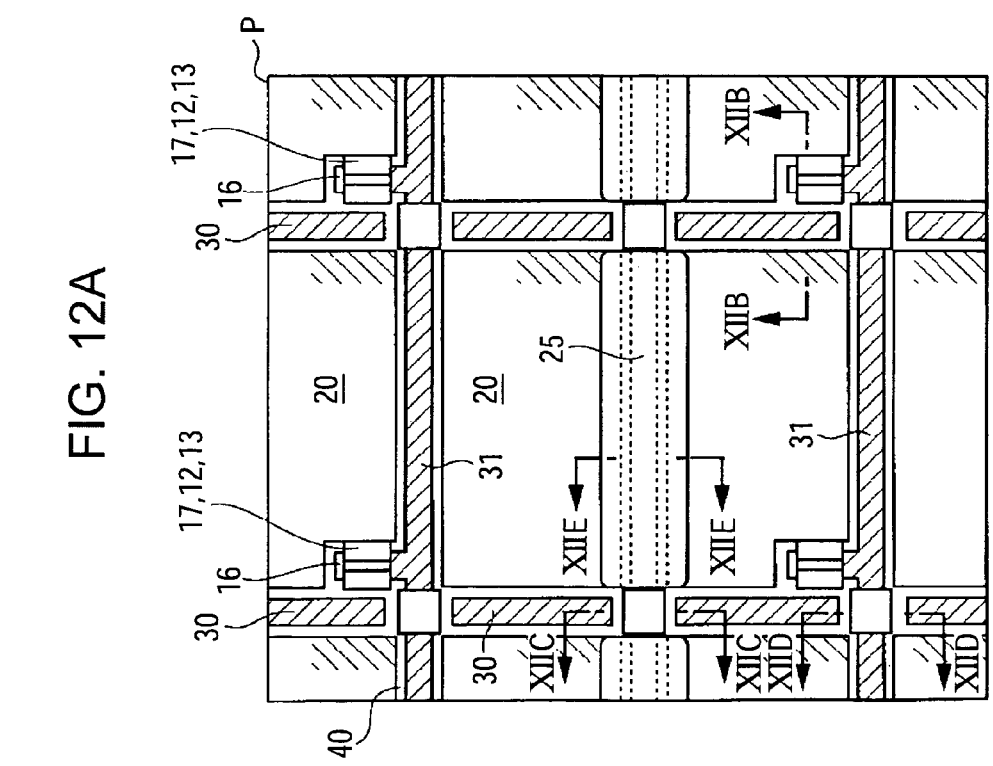

PIXEL ELECTRODES AND SWITCHING ELEMENTS FORMED ON SAME SUBSTRATE IN OPENINGS OF INSULATING FILM FORMED ON THE SUBSTRATE

BACKGROUND

1. Technical Field

The present invention relates to a pixel structure, to an active matrix substrate, to a method of manufacturing an active matrix substrate, to an electro-optical device, and to an electronic apparatus.

2. Related Art

For example, in an active matrix liquid crystal display device, a switching element is provided in each pixel, and the switching operation of each pixel is performed by the switching element. For example, a TFT (thin film transistor) is used as the switching element.

An active matrix substrate having the TFTs thereon is generally manufactured as follows: gate electrodes and semiconductor layers (for example, amorphous silicon layers and N-type silicon layers) are formed, and then electrode wiring lines (for example, source lines and drain lines) or pixel electrodes (for example, transmissive conductive films) are formed thereon (for example, see Japanese Patent No. 3,261,699).

In a process of manufacturing the active matrix substrate, the formed semiconductor layer is subjected to thermal restrictions. For example, when the formed semiconductor layer is heated at a temperature of about 250 to 300° C., element characteristics thereof may be deteriorated due to hydrogen desorption. As a result, the thermal restrictions of the semiconductor layers have a large effect on a method of forming the electrode wiring lines or the pixel electrodes which are formed after the semiconductor layers, such that it is difficult in being able to reduce manufacturing costs.

SUMMARY

An advantage of some aspects of the invention is that it provides a pixel structure which is not effected by the thermal restrictions in a manufacturing process and is capable of reducing manufacturing costs, and a method of manufacturing an active matrix substrate having the pixel structure.

According to an aspect of the invention, a pixel structure includes: pixel electrodes; and switching elements which correspond to the pixel electrodes. The pixel electrodes and the switching elements are formed on the same substrate, and each pixel electrode is provided in a layer on the substrate, not on a semiconductor layer of the switching element.

According to this structure, since the pixel electrode is provided in a layer on the substrate, not on the semiconductor layer of the switching element, it is possible to form the pixel electrodes before the semiconductor layers are formed. That is, it is possible to form the pixel electrodes without being affected by the thermal restrictions of the semiconductor layers. Therefore, this pixel structure does not interfere with the method of forming the pixel electrodes, and is advantageous in reducing the manufacturing costs and in introducing a film forming method with a liquid material.

In the above-mentioned structure, it is preferable that the pixel electrodes be provided in a first layer on the substrate (a layer closest to the surface of the substrate).

According to this structure, a wide selection of materials and means for forming the pixel electrodes can be made with the arrangement of the pixel electrodes in the first layer on the substrate.

This structure includes a structure in which a film which is not directly connected with the switching operation, such as a protective film for preventing the permeation of a material or an adhesive film for improving adhesion, is provided between the pixel electrodes and the surface of the substrate.

Further, in the above-mentioned structure, preferably, the pixel structure further includes capacitors corresponding to the pixel electrodes, and the pixel electrodes and conductive lines constituting the capacitors are provided in the same layer on the substrate.

According to this structure, since the pixel electrodes and the conductive lines of the capacitors are provided in the same layer on the substrate, a common process can be performed to form the pixel electrodes and the conductive lines, which results in a simple manufacturing process.

Furthermore, in the above-mentioned structure, it is preferable that the pixel electrodes and the conductive lines of the capacitors include the same material film.

According to this structure, since the pixel electrodes and the conductive lines of the capacitors include the same material film and are provided in the same layer on the substrate, the material forming the pixel electrodes is simultaneously arranged with the material forming the conductive lines.

In the above-mentioned structure, it is preferable that the pixel structure further include auxiliary electrodes each of which is electrically connected to the pixel electrode and covers the conductive line of the capacitor with an insulating film interposed therebetween.

According to this structure, the auxiliary electrode functions as a portion of the pixel electrode, and the auxiliary electrode is arranged opposite to the conductive line of the capacitor with the insulating film interposed therebetween.

Further, in the above-mentioned structure, it is preferable that the pixel electrodes, the conductive lines of the capacitors, the auxiliary electrodes, and the insulating films be composed of transmissive films.

According to this structure, since light passes through the capacitors as well as the pixel electrodes, the pixel structure can have a large transmissive region (a high aperture ratio).

Furthermore, in the above-mentioned structure, preferably, the pixel structure further includes banks which are formed on the substrate to partition the pixel electrodes and/or the capacitors.

According to this structure, a liquid phase method can be used to form the pixel electrodes and/or the capacitors. In the liquid phase method, a liquid material is arranged on the substrate, and a thermal treatment is performed thereon, thereby obtaining a conductive film. The liquid material can be arranged by, for example, a liquid droplet discharging method, a Cap coating method, or a sputtering method. When the liquid materials forming the pixel electrodes and/or the capacitors are arranged on the substrate, the banks are used to define the arrangement regions of the liquid materials. The use of the liquid phase method makes it possible to achieve a simple manufacturing process, a reduction in the amount of materials used, and a reduction in the manufacturing costs. Since the pixel electrodes and the capacitors are provided in the same layer on the substrate, the banks for partitioning the pixel electrodes and the capacitors can be formed at the same time.

In the above-mentioned structure, preferably the switching elements are thin film transistors, and gate electrodes of the switching elements and the pixel electrodes are provided in the same layer on the substrate.

According to this structure, since the pixel electrodes and the gate electrodes are provided in the same layer on the substrate, a common process can be performed to form the pixel electrodes and the conductive lines, which results in a simple manufacturing process.

Furthermore, in the above-mentioned structure, it is preferable that banks for partitioning the pixel electrodes and/or the gate electrodes be formed on the substrate.

According to this structure, it is possible to use the liquid phase method to form the pixel electrode and/or the gate electrodes and thus to reduce manufacturing costs. When the liquid materials forming the pixel electrodes and/or the gate electrodes are arranged on the substrate, the banks are used to define the arrangement regions of the liquid materials. Since the pixel electrodes and the gate electrodes are provided in the same layer on the substrate, the banks for partitioning the pixel electrodes and the gate electrodes can be formed at the same time.

Moreover, in the above-mentioned structure, it is preferable that gate lines, source lines, and the pixel electrodes be provided in the same layer in the substrate.

According to this structure, since the pixel electrodes, the gate electrodes, the gate lines, and the source lines are provided in the same layer on the substrate, a common process can be performed to form these components, which results in a simple manufacturing process.

Further, in the above-mentioned structure, it is preferable that the gate electrodes, the gate lines, and the source lines include the same material film.

According to this structure, since the gate electrodes, the gate lines, and the source lines include the same material film and are provided in the same layer on the substrate, the materials forming the gate electrodes, the gate lines, and the source lines are arranged at the same time.

Furthermore, in the above-mentioned structure, it is preferable that banks for partitioning the gate lines and/or the sources lines be formed on the substrate.

According to this structure, it is possible to use the liquid phase method to form the gate lines and/or the source lines and thus to reduce the manufacturing costs. When the liquid materials forming the gate lines and/or the source lines are arranged on the substrate, the banks are used to define the arrangement regions of the liquid materials. Since the pixel electrodes, the gate electrodes, the gate lines, and the source lines are provided in the same layer on the substrate, the banks for partitioning these components can be formed at the same time.

According to another aspect of the invention, an active matrix substrate includes the above-mentioned pixel structure.

This active matrix substrate makes it possible to reduce manufacturing costs.

According to still another aspect of the invention, there is provided a method of manufacturing an active matrix substrate having pixel electrodes and switching elements corresponding to the pixel electrodes formed thereon. The method includes forming semiconductor layers of the switching elements on the substrate; and forming the pixel electrodes on the substrate before forming the semiconductor layers.

According to this manufacturing method of this aspect, it is possible to form the pixel electrodes without being affected by thermal restrictions of the semiconductor layers before forming the semiconductor layers of the switching elements. Therefore, a wide selection of materials and means for forming the pixel electrodes can be made with this structure, and a reduction in manufacturing costs can be achieved.

Further, in the above-mentioned manufacturing method according to this aspect, it is preferable that the forming of the pixel electrodes be performed by at least one of a vapor deposition method (including a CVD method), a sputtering method, and a liquid phase method.

In this case, for example, the pixel electrodes may be formed by forming a material film of the pixel electrodes on the entire surface of the substrate, and then by patterning the material film. The first layer on the substrate makes it possible to easily perform this film forming process.

Further, in this aspect, preferably, the forming of the pixel electrodes by using the liquid phase method includes: forming, on the substrate, partition members which partition regions where the pixel electrodes are arranged; arranging a liquid material forming the pixel electrodes in the regions partitioned by the partition members; and performing a thermal treatment on the material films of the pixel electrodes.

When the pixel electrodes are formed by the liquid phase method, the thermal treatment is preferably performed on the material film at a relatively high heating temperature (baking temperature) of 250° C. or more in order to obtain practical conductivity. The manufacturing method can form the pixel electrodes having good conductivity by a relatively high thermal treatment without being affected by thermal restrictions of the semiconductor layers. In addition, the use of the liquid phase method makes it possible to reduce the manufacturing costs.

Furthermore, in the manufacturing method according to this aspect, it is preferable that the partition members be banks or regions having a lyophobic property with respect to the material forming the pixel electrodes.

The banks or the lyophobic regions define the arrangement regions of the material forming the pixel electrodes.

Moreover, in the manufacturing method according to this aspect, it is preferable that the banks be formed by a photolithography method.

Further, in the manufacturing method according to this aspect, it is preferable that the regions having the lyophobic property be formed by using a self-assembled film. Furthermore, in this aspect, preferably, the method of manufacturing an active matrix substrate further includes forming capacitors corresponding to the pixel electrodes on the substrate before forming the semiconductor layers, and the forming of the pixel electrodes and the forming of the capacitors are simultaneously performed with at least one of forming the partition members, arranging the materials, and performing a thermal treatment on the material films.

According to this manufacturing method of this aspect, a common process can be performed to form the pixel electrodes and the capacitors, resulting in a simplified manufacturing process.

Moreover, in this aspect, preferably, the method of manufacturing an active matrix substrate further includes forming gate electrode's on the substrate before forming the semiconductor layers. In addition, preferably, the switching elements are thin film transistors, and the forming of the gate electrodes is performed by a liquid phase method.

According to the above-mentioned manufacturing method of this aspect, since the liquid phase method is used, the manufacturing costs can be reduced.

Further, in the manufacturing method according to this aspect, it is preferable that the forming of the pixel electrodes and the forming of the gate electrodes be simultaneously performed with at least one of forming the partition members and performing a thermal treatment on the material films.

According to the above-mentioned manufacturing method of this aspect, a common process can be performed to form the pixel electrodes and the gate electrodes, which results in a simple manufacturing process.

Furthermore, in this aspect, preferably, the method of manufacturing an active matrix substrate further includes forming drain electrodes electrically connected to the semiconductor layers; and forming source electrodes electrically connected to the semiconductor layers. In addition, preferably, the forming of the drain electrodes and the forming of the source electrodes are performed by the liquid phase method.

According to the above-mentioned manufacturing method of this aspect, since the liquid phase method is used, the manufacturing costs can be reduced.

Moreover, in the manufacturing method of this aspect, it is preferable that the semiconductor layers be electrically connected to the pixel electrodes through the drain electrodes at the same time when the drain electrodes are formed. The manufacturing method of this aspect makes it possible to achieve a simple forming process.

Further, in the manufacturing method of this aspect, it is preferable that the semiconductor layers be electrically connected to the source lines through the source electrodes at the same time when the source electrodes are formed. The manufacturing method of this aspect makes it possible to achieve a simple forming process.

Furthermore, in this aspect, preferably, the method of manufacturing an active matrix substrate further includes forming gate lines and source lines on the substrate so as to intersect each other, and the forming of the gate lines and the source lines is performed by the liquid phase method.

According to the manufacturing method of this aspect, since the liquid phase method, the manufacturing costs can be reduced.

Moreover, in the manufacturing method of this aspect, preferably, the forming of the gate lines and the source lines includes: forming conductive films having an intersection pattern in which one of the gate line and the source line is branched at an intersection therebetween, before forming the semiconductor layer; and electrically connecting the branched conductive films after forming the semiconductor layer.

According to the above-mentioned manufacturing method of this aspect, it is possible to arrange the gate lines and the source lines so as to intersect each other in the same layer on the substrate.

Further, in the above-mentioned manufacturing method of this aspect, preferably, the forming of the conductive films and the forming of the gate electrodes are simultaneously performed with at least one of forming the partition members, arranging the materials, and performing a thermal treatment on the material films.

According to the above-mentioned manufacturing method of this aspect, a common process can be performed to form the gate lines, the source lines, and the gate electrodes, which results in a simple manufacturing process.

Furthermore, in the above-mentioned manufacturing method of this aspect, preferably, the electrical connecting of the branched conductive films, the forming of the drain electrodes, and the forming of the source electrodes are simultaneously performed with at least one of forming the partition members, arranging the materials, and performing a thermal treatment on the material films.

According to the above-mentioned manufacturing method of this aspect, a common process can be performed to form the gate lines, the source lines, the drain electrodes, and the source electrodes, which results in a simple manufacturing process.

According to yet another aspect of the invention, an electro-optical device includes the above-mentioned active matrix substrate.

The electro-optical device according to this aspect makes it possible to reduce manufacturing costs.

According to still yet another aspect of the invention, an electronic apparatus includes the above-mentioned electro-optical device.

The electronic apparatus according to this aspect makes it possible to reduce manufacturing costs.

BRIEF DESCRIPTION OF THE DRAWINGS

The invention will be described with reference to the accompanying drawings, wherein like numbers reference like elements.

FIG. 1 is an enlarged plan view illustrating a portion of an active matrix substrate according to an embodiment of the invention.

FIG. 4 is a plan view illustrating the overall structure of the liquid crystal display device.

FIGS. 6A and 6B are diagrams illustrating a method of manufacturing the active matrix substrate.

FIGS. 7A and 7B are diagrams illustrating the method of manufacturing the active matrix substrate.

FIGS. 8A and 8B are diagrams illustrating the method of manufacturing the active matrix substrate.

FIGS. 9A and 9B are diagrams illustrating the method of manufacturing the active matrix substrate.

FIGS. 10A to 10D are diagrams illustrating the method of manufacturing the active matrix substrate.

FIGS. 11A to 11D are diagrams illustrating the method of manufacturing the active matrix substrate.

FIGS. 12A to 12E are diagrams illustrating the method of manufacturing the active matrix substrate.

DESCRIPTION OF EXEMPLARY EMBODIMENTS

Figure 2A:
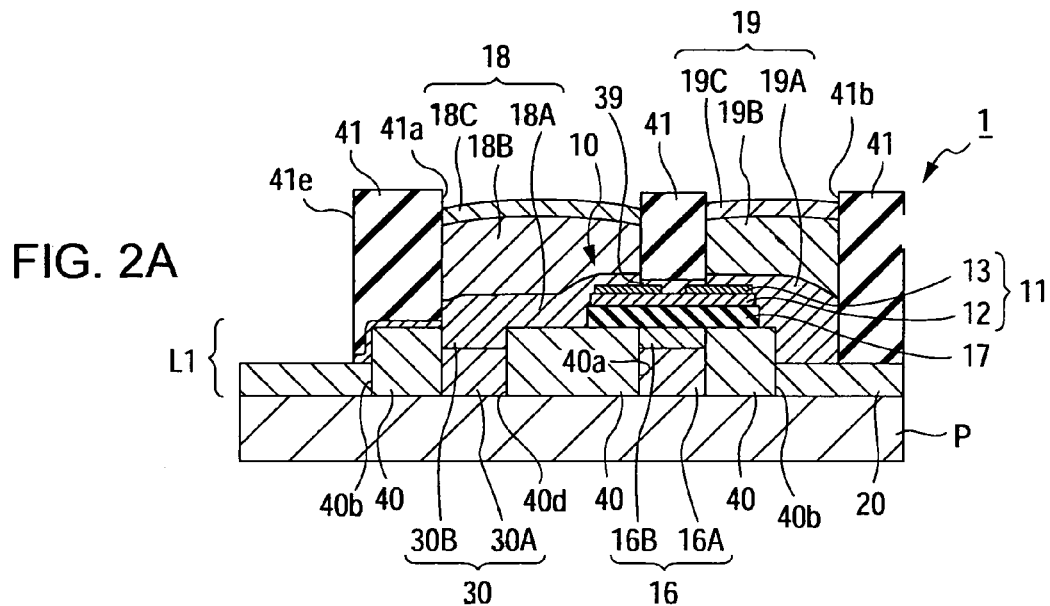
FIG. 2A is a cross-sectional view taken along the line IIA-IIA of FIG. 1.

Hereinafter, a pixel structure, an active matrix substrate, a method of manufacturing an active matrix substrate, an electro-optical device, and an electronic apparatus according to preferred embodiments of the invention will be described with reference to the accompanying drawings. In addition, a scale of each component is adjusted to have a recognizable size in the drawings.

Active Matrix Substrate

Figure 2B:
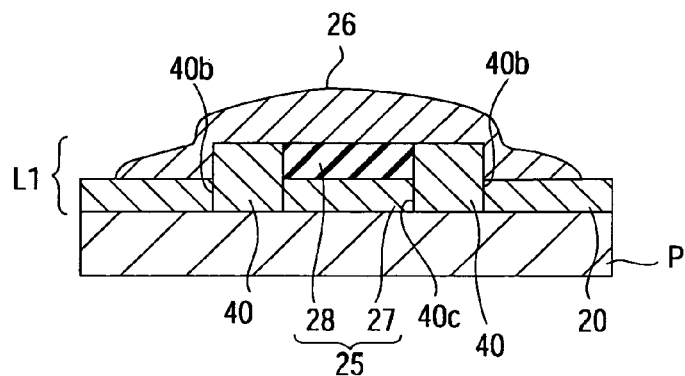
FIG. 2B is a cross-sectional view taken along the line IIB-IIB of FIG. 1.
Figure 2C:
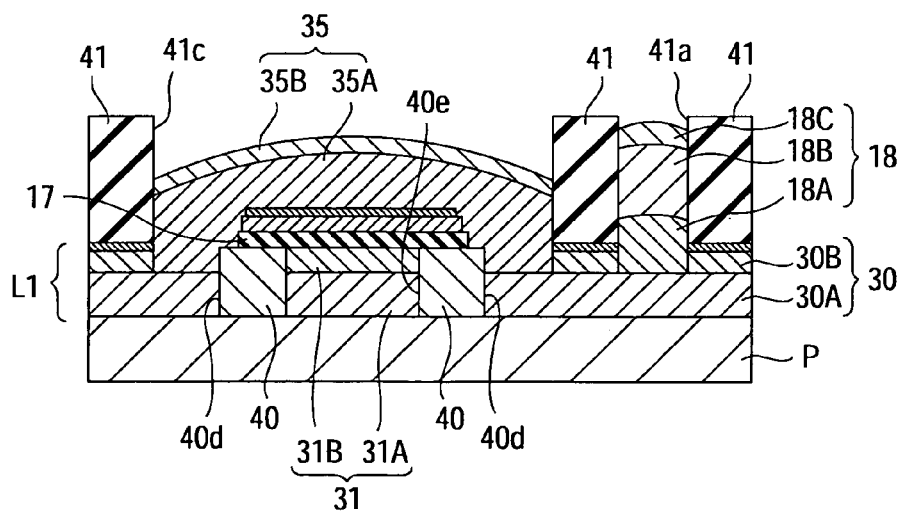
FIG. 2C is a cross-sectional view taken along the line IIC-IIC of FIG. 1.

FIG. 1 is an enlarged plan view illustrating a portion of an active matrix substrate according to the invention. FIG. 2A is a cross-sectional view taken along the line IIA-IIA of FIG. 1. FIG. 2B is a cross-sectional view taken along the line IIB-IIB of FIG. 1. FIG. 2C is a cross-sectional view taken along the line IIC-IIC of FIG. 1.

As shown in FIG. 1, an active matrix substrate 1 includes wiring lines (source lines 30 and gate lines 31) having a lattice pattern, pixel electrodes 20 arranged in regions surrounded by the wiring lines, TFTs 10, serving as switching elements corresponding to the pixel electrodes 20, and capacitors 25.

Pixel Structure

As shown in FIGS. 2A, 2B, and 2C, the TFT 10 is an amorphous-silicon-type TFT (an α-Si TFT) having a bottom gate structure (an inverted-staggered structure), and includes a semiconductor layer 11, a gate electrode 16 provided between the semiconductor layer 11 and a substrate P (for example, a glass substrate), a gate insulating film 17 provided between the semiconductor layer 11 and the gate insulating film 16, and source and drain electrodes 18 and 19 electrically connected to the semiconductor layer 11.

The semiconductor layer 11 includes an amorphous silicon layer (α-Si) 12 and an $N^+$ silicon layer ($n^+$-Si) 13 formed on the amorphous silicon layer 12. The $N^+$ silicon layer 13 is divided into two portions separated from each other on the amorphous silicon layer 12 in plan view. One portion (a source region which is shown on the left side of FIG. 2A) of the $N^+$ silicon layer 13 is electrically connected to the source line 30, serving as a signal line, through the source electrode 18, and the other portion (a drain region) of the $N^+$ silicon layer 13 is electrically connected to the pixel electrode 20 through the drain electrode 19. In addition, the gate electrode 16 is electrically connected to the gate line 31 serving as a scanning line.

As described above, the pixel electrode 20 is electrically connected to a drain of the TFT 10 through the drain electrode 19. Therefore, when the TFT 10 is turned on for a predetermined period of time by a gate signal input through the gate line 31, an image signal supplied through the source line 30 is supplied to the pixel electrode 20. When liquid crystal is provided between the pixel electrodes 20 and a counter electrode, the pixel signal is held in the liquid crystal for a predetermined period of time.

The capacitor 25 prevents the leakage of the image signal held in the liquid crystal, and includes an auxiliary electrode 26 which is electrically connected to the pixel electrode 20 and constitutes the pixel electrode 20, a capacitor line 27 which is composed of a conductive film and is arranged opposite to the auxiliary electrode 26, and an insulating film 28 provided between the auxiliary electrode 26 and the capacitor line 27.

This pixel structure is characterized in that the gate electrode 16, the pixel electrode 20, the capacitor line 27, the source line 30, and the gate line 31 are arranged on the same surface of the substrate P, in a first layer L1 closest to the surface of the substrate P.

More specifically, banks (an insulating film) 40, serving as partitioning members for defining forming regions of the gate electrode 16, the pixel electrode 20, the capacitor line 27, the source line 30, and the gate line 31, are formed on the substrate P. The gate electrode 16, the pixel electrode 20, the capacitor line 27, the source line 30, and the gate line 31 are provided in openings 40a, 40b 40c, 40d, and 40e of the banks 40, respectively. In addition, the banks 40 are collectively formed on the substrate P by a patterning technique, such as photolithography.

The gate electrode 16 has a two-layer structure in which a lower layer (a base layer) 16A formed of one or more metallic materials selected from, for example, Ag, Cu, and Al and an upper layer (a covering layer) 16B formed of one or more metallic materials selected from, for example, Ni, Ti, W, and Mn are laminated on the substrate P. In the two-layer structure, the covering layer 16B effectively prevents the diffusion of Ag, Cu, or Al constituting the base layer 16A to the gate insulating film 17, and thus the two-layer structure has a function of preventing an operational defect of the TFT 10 or the lowering of mobility. In addition, an adhesive layer may be provided between the base layer 16A and the substrate P in order to improve adhesion therebetween. The adhesive layer may be formed of, for example, Mn, or it may be formed by a liquid phase method using a liquid material having Mn minute particles dispersed therein.

Further, the source line 30 and the gate line 31 each have a two-layer structure in which the lower layer (the base layer) 16A formed of one or more metallic materials selected from, for example, Ag, Cu, and Al and the upper layer (the covering layer) 16B formed of one or more metallic materials selected from, for example, Ni, Ti, W, and Mn are laminated on the substrate P, similar to the gate electrode 16.

The gate electrode 16, the source line 30, and the gate line 31 are formed of the same material at the same time.

The pixel electrode 20 is composed of a conductive film formed of a transmissive material, such as ITO (indium tin oxide). Also, the capacitor line 27 is composed of a conductive film formed of a transmissive material, such as ITO (indium tin oxide). The pixel electrode 20 and the capacitor line 27 are formed of the same material at the same time. In addition, in the opening 40c of the bank 40 having the capacitor line 27 formed therein, the insulating film 28 is formed on the capacitor line 27, and the auxiliary electrode 26 is formed on the insulating film 28 so as to be electrically connected to the pixel electrode 20. The auxiliary electrode 26 is composed of a conductive film formed of a transmissive material, such as ITO (indium tin oxide), and is arranged so as to cover a portion of the pixel electrode 20, the insulating film 28, and a portion of the bank 40. The insulating film 28 is formed of an insulating material having high transmittance, such as polysilazane.

As such, in the pixel structure, since the gate electrode 16, the pixel electrode 20, the capacitor line 27, the source line 30, and the gate line 31 are on the same surface of the substrate P in the first layer L1, a common process may be performed to form these components. For example, at least one of a process for forming the bank 40, which is a partitioning member, a process for arranging materials forming these components, and a thermal treatment on the material film arranged on the substrate P can be performed at the same timing. In addition, these components are arranged in the first layer L1 closest to the surface of the substrate P, and the surface of the substrates having these components arranged thereon is relatively flat. Therefore, the same process can be used to manufacture these components, as compared with a manufacturing method in which processes are performed on a surface having step portions.

Further, since the gate electrode 16, the pixel electrode 20, the capacitor line 27, the source line 30, and the gate line 31 are partitioned by the bank 40 in the first layer L1, it is possible to use a liquid phase method to form these components. In the liquid phase method, a liquid material is applied onto the substrate P to form a film, and a thermal treatment is performed on the film, thereby obtaining a conductive film. The liquid material can be applied by, for example, a liquid droplet discharging method, a Cap coating method, and a sputtering method. When a liquid material forming these components is arranged onto the substrate P, the bank 40 is used as a partitioning member for defining arrangement regions of the liquid material. The use of the liquid phase method is advantageous in that it reduces the number of manufacturing processes, reduces the amount of liquid material used, and reduces the manufacturing costs. Further, since the gate electrode 16, the pixel electrode 20, the capacitor line 27, the source line 30, and the gate line 31 are formed in the same layer on the substrate P, it is possible to simultaneously form the banks 40 for partitioning these components.

Next, the semiconductor layer 11, the source electrode 18, and the drain electrode 19 are formed on the first layer L1.

More specifically, a gate insulating film 17 formed of, for example, a silicon nitride or a silicon oxide is formed in a region on the bank 40 including the gate electrode 16, and the semiconductor layer 11 is formed on a portion of the gate insulating film 17 overlapping the gate electrode 16 in plan view. That is, the gate electrode 16, the gate insulating film 17, the amorphous silicon layer 12, and the N+ silicon layer 13 are formed on the substrate P in this order (the bottom gate structure, and the inverted-staggered structure).

Further, banks (an insulating film) 41, serving as partitioning members for defining the forming regions of the source electrode 18 and the drain electrodes 19, are formed on the first layer L1, and the source electrode 18 and the drain electrode 19 are provided in openings 41a and 41b of the banks 41, respectively. In addition, the banks 41 are collectively formed on the first layer L1 by a patterning technique, such as photolithography.

The source electrode 18 has a three-layer structure in which a lower layer (a barrier layer) 18A formed of one or more metallic materials selected from, for example, Ni, Ti, W, and Mn, an intermediate layer (a base layer) 18B formed of one or more metallic materials selected from, for example, Ag, Cu, and Al, and an upper layer (a covering layer) 18C formed of one or more metallic materials selected from, for example, Ni, Ti, W, and Mn are laminated. In the three-layer structure, the barrier layer 18A effectively prevents the diffusion of Ag, Cu, or Al constituting the base layer 18B to the amorphous silicon layer 12, and the N+ silicon layer 13, and the gate insulating film 17, and thus the three-layer structure has a function of preventing an operational defect of the TFT 10 or lowering of the mobility. In addition, the bank 41 has the opening 41a passing through a region including a portion of the source line 30 and the source region of the semiconductor layer 11 in the first layer L1, and the above-mentioned conductive material is filled into the opening 41a to form the source electrode 18, which causes the source electrode of the semiconductor layer 11 to be electrically connected to the source line 30 through the source electrode 18.

Further, similar to the source electrode 18, the drain electrode 19 has a three-layer structure in which a lower layer (a barrier layer) 19A formed of one or more metallic materials selected from, for example, Ni, Ti, W, and Mn, an intermediate layer (a base layer) 19B formed of one or more metallic materials selected from, for example, Ag, Cu, and Al, and an upper layer (a covering layer) 19C formed of one or more metallic materials selected from, for example, Ni, Ti, W, and Mn are laminated. In addition, the bank 41 has the opening 41b passing through a region which includes a portion of the pixel electrode 20 and the drain region of the semiconductor layer 11 in the first layer L1, and the above-mentioned conductive material is filled into the opening 41b to form the drain electrode 19, which causes the drain electrode of the semiconductor layer 11 to be electrically connected to the pixel electrode 20 through the drain electrode 19.

The source electrode 18 and the drain electrode 19 are formed with the same material at the same time.

Further, a protective layer 39 is formed between the bank 41 and the semiconductor layer 11 (the amorphous silicon layer 12 and the N+ silicon layer 13), if necessary. This protective film 39 has a function for preventing metal (for example, alkali metal (movable ions)) from being permeated into the semiconductor layer 11 through the bank 41. When the bank 41 has such a function, the protective film 39 may not be provided.

As such, in the pixel structure, the semiconductor layer 11 is formed on the first layer L1 including the pixel electrode 20. Since the pixel electrode 20 is provided on the substrate P, not the semiconductor layer 11, the pixel electrode 20 can be formed before the semiconductor layer 11 is formed. That is, it is possible to form the pixel electrode 20 without being affected by the thermal restrictions of the semiconductor layer 11 in the manufacturing process. Therefore, the pixel structure has a small restriction in forming the pixel electrode 20 and thus is advantageous because of the reduction in manufacturing costs. For example, a liquid phase method which is advantageous in reducing the manufacturing costs can be used to form the pixel electrode 20.

Further, since the source electrode 18 and the drain electrode 19 are partitioned by the banks 41 of the first layer L1, the liquid phase method can be used to form these components. When a liquid material forming these components is arranged onto the substrate P, the banks 41 are used as partition members for defining arrangement regions of the liquid material. The use of the liquid phase method is advantageous in that it reduces the number of manufacturing processes, reduces the amount of a liquid material used, and reduces the manufacturing costs. Further, since the source electrode 18 and the drain electrode 19 are formed in the same layer on the substrate P, it is possible to simultaneously form the banks 41 for partitioning these components.

Referring to FIG. 1 again, in the active matrix substrate 1, the source lines (signal lines) 30 and the gate lines (scanning lines) 31 are arranged so as to intersect each other, thereby forming a lattice pattern. That is, a plurality of gate lines 31 extend in the horizontal direction of FIG. 1, and a plurality of source lines 30 extend in a direction intersecting these gate lines (in the vertical direction of FIG. 1). As described above, in the active matrix substrate 1, since the source lines 30 and the gate lines 31 are arranged on the same surface of the substrate P, one type of wiring line (the gate line 31) is arranged so as to detour around the other type of wiring line (the source line 30) at an intersection of the source line 30 and the gate line 31 on the substrate P.

More specifically, as shown in FIG. 2C, in the first layer L1, a plurality of divided source lines 30 are provided at both sides of each gate line 31. In addition, an auxiliary conductive film 35 is provided at intersections of the source lines 30 and the gate line 31 on the first layer L1 so as to be laid across the gate line 31. The auxiliary conductive film 35 is electrically connected to the two divided source lines 30, and the auxiliary conductive film 35 is insulated from the gate line 31 by the gate insulating film 17. The auxiliary conductive film 35 has a two-layer structure in which a lower layer (a base layer) 35A formed of one or more metallic materials selected from, for example, Ag, Cu, and Al and an upper layer (a covering layer) 35B formed of one or more metallic materials selected from, for example, Ni, Ti, W, and Mn are laminated. The bank 41 formed on the first layer L1 has the opening 41c passing through a portion of each of the two divided source lines 30 at the intersection of the source line 30 and the gate line 31, and the above-mentioned conductive material is filled up into the opening 41c, which causes the two divided source lines 30 to be electrically connected to each other. In this embodiment, at the intersection of the source line 30 and the gate line 31, the source line 30 is divided into a plurality of portions, but the gate line 31 may be divided into a plurality of portions.

As shown in FIG. 1, in the active matrix substrate 1, the source lines (the signal lines) 3b intersect the capacitor lines 27. That is, a plurality of capacitor lines 27 extend in the horizontal direction of FIG. 1, and a plurality of source lines 30 extend in a direction intersecting these capacitor lines 27 (in the vertical direction of FIG. 1). As described above, in the active matrix substrate 1, since the source lines 30 and the capacitor lines 27 are arranged on the same surface of the substrate P, one type of wiring line (the source line 30) is arranged so as to detour around the other type of wiring line (the capacitor line 27) at an intersection of the source line 30 and the capacitor line 27 on the substrate P. In this embodiment, at the intersection of the source line 30 and the capacitor line 27, the source line 30 is divided into a plurality of portions, but the capacitor line 27 may be divided into a plurality of portions. However, practically, it is preferable that the source line 30 be divided into a plurality of portions as in this embodiment.

More specifically, a plurality of divided source lines 30 are provided at both sides of each capacitor line 27 of the first layer on the substrate P. In addition, an auxiliary conductive film 36 is provided at intersections of the source lines 30 and the capacitor line 27 so as to be laid across the capacitor line 27. The auxiliary conductive film 36 is electrically connected to the two divided source lines 30, and the auxiliary conductive film 36 is insulated from the capacitor line 27 by the gate insulating film (see FIGS. 15A to 15C). The bank 41 formed on the first layer L1 has an opening 41d passing through a portion of each of the two divided source lines 30 at the intersection of the source line 30 and the capacitor line 27, and the auxiliary conductive film is filled up into the opening 41d, which causes the two divided source lines 30 to be electrically connected to each other. The auxiliary conductive film 36 located at the intersection of the source line 30 and the capacitor line 27 and the auxiliary conductive film 35 located at the intersection of the source line 30 and the gate line 31 are formed of the same material at the same time.

This structure is characterized in that, in the active matrix substrate 1, the gate electrodes 16, the pixel electrodes 20, the capacitor lines 27, the source lines 30, and the gate lines 31 are arranged on the same surface of the substrate P, in the first layer L1 closest to the surface of the substrate P. Therefore, this structure makes it possible to achieve a simple manufacturing process and a reduction in the amount of a material used.

Further, in the active matrix substrate 1, since the capacitor lines 27 constituting the capacitors 25, the auxiliary electrodes 26, and the insulating film 28 are composed of transmissive films, the capacitors 25 as well as the pixel electrodes 20 can transmit light. Therefore, it is possible to achieve a wide transmissive region in the pixel structure (an improvement in the aperture ratio).

Furthermore, in this embodiment, the capacitor 25 is arranged in the vicinity of the center of each pixel electrode 20 as shown in FIG. 1, but the arrangement position is not limited thereto. For example, the capacitor 25 may be arranged around the edge of each pixel electrode 20.

Moreover, the capacitor 25 may be formed of an opaque material.

Liquid Crystal Display Device

Figure 3:
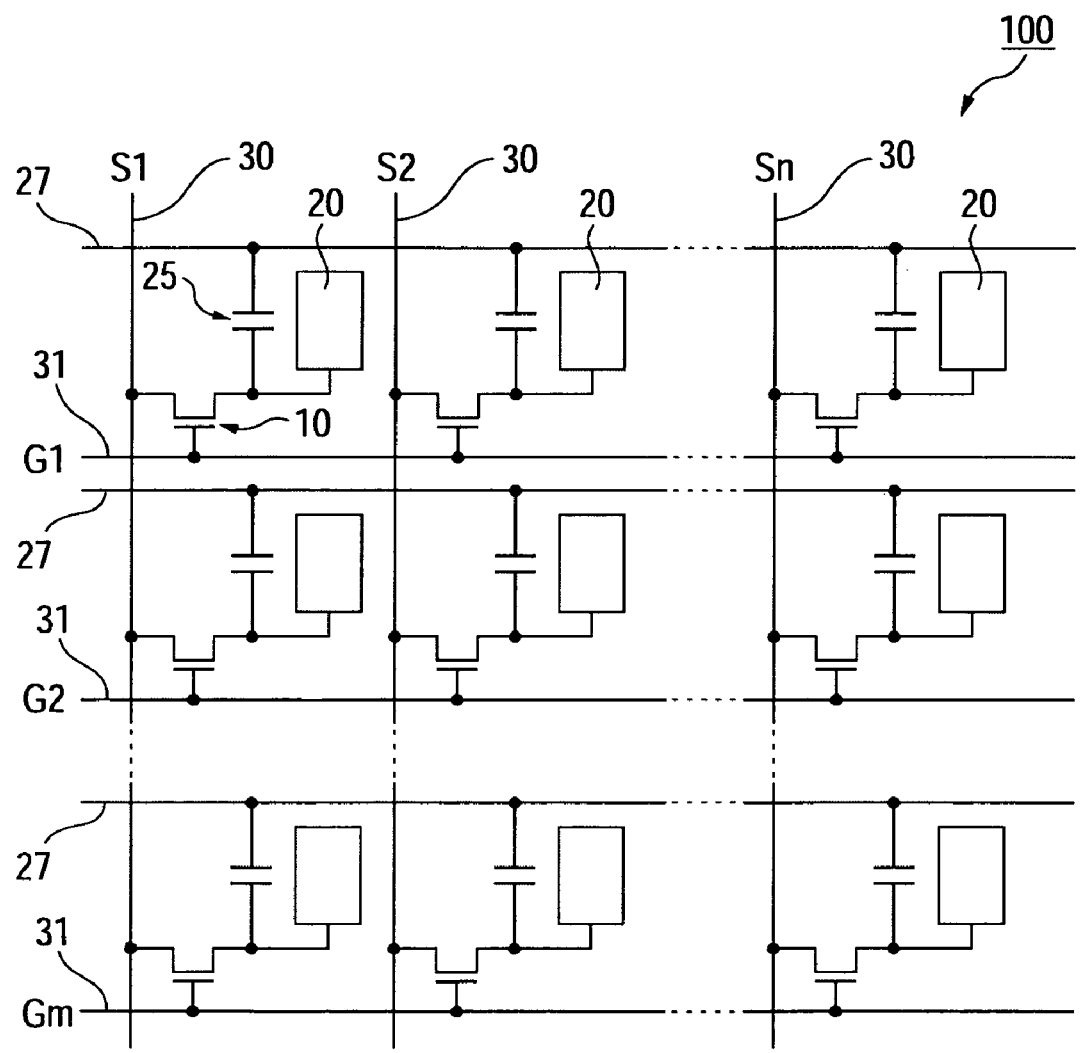
FIG. 3 is an equivalent circuit diagram of a liquid crystal display device according to an embodiment of the invention.

FIG. 3 is an equivalent circuit diagram of a liquid crystal display device 100, which is an embodiment of an electro-optical device according to the invention. The liquid crystal display device 100 includes the active matrix substrate shown in FIG. 1.

As shown in FIG. 3, in the liquid crystal display device 100, a plurality of dots constituting an image display region are arranged in a matrix, and each dot is provided with the pixel electrode 20, serving as a transmissive conductive film, and a thin film transistor (the TFT 10), serving as a switching element for controlling the pixel electrode 20. Each signal line (the source line 30) through which image signals are supplied is electrically connected to the source of the TFT 10. Image signals S1, S2, . . . , Sn are line-sequentially supplied to the source lines 30 in this order, or they are supplied to every group of source lines 30 adjacent to each other. In addition, each scanning line (the gate line 31) is electrically connected to the gate of the TFT 10, and scanning signals G1, G2, . . . , Gm are line-sequentially applied to a plurality of gate lines 31 at a predetermined timing in a pulse manner. Each pixel electrode 20 is electrically connected to the drain of the TFT 10, and by turning on the TFTs 10, serving as switching elements, for a predetermined period, the image signals S1, S2, . . . , Sn supplied from the source lines 30 are written onto the pixel electrodes 20 at a predetermined timing.

The image signals S1, S2, . . . , Sn having predetermined levels written onto liquid crystal via the pixel electrodes 20 are held between the pixel electrode 20 and a common electrode, which will be described later. The alignment or order of the liquid crystal molecules changes according to the applied voltage levels, and thus light is modulated, which makes it is possible to display gray-scale images. Each dot is further provided with a storage capacitor (the capacitor 25) arranged in parallel to a liquid crystal capacitor between the pixel electrode 20 and the common electrode to prevent the leakage of the image signals written onto the liquid crystal. Reference numeral 27 indicates a capacitor line connected to one electrode of the storage capacitor.

FIG. 4 is a diagram illustrating the overall structure of the liquid crystal display device 100.

As shown in FIG. 4, the liquid crystal display device 100 includes a TFT array substrate (the active matrix substrate 1), a counter substrate 50, and a sealing member 52 having a substantially rectangular shape in plan view. The TFT array substrate is bonded to the counter substrate 50 with the sealing member 52 interposed therebetween. The liquid crystal interposed between the substrates 1 and 50 is sealed by the sealing member 52. In FIG. 4, the outer periphery of the counter substrate 50 overlaps the outer periphery of the sealing member 52 in plan view.

In addition, a light-shielding film 53 (peripheral partition) made of a light-shielding material is formed on the inside of the sealing member 52. A data line driving circuit 201 and mounting terminals 202 are formed along one side of the active matrix substrate 1 in a peripheral circuit region outside the sealing member 52, and scanning line driving circuits 104 are formed along two sides of the active matrix substrate 1 adjacent to the one side. A plurality of wiring lines 105 is provided at the remaining side of the active matrix substrate 1 to connect the scanning line driving circuits 104. Further, a plurality of inter-substrate conduction members 106 are arranged at the corners of the counter substrate 50 to electrically connect the active matrix substrate 1 and the counter substrate 50.

Furthermore, actually, an alignment film for controlling an initial alignment state of the liquid crystal is formed on the inner surface (for example, the surfaces of the pixel electrodes) of the active matrix substrate 1, and a retardation plate and a polarizing plate for controlling the polarized state of light incident on the liquid crystal layer are provided on the outer surface of the active matrix substrate 1. In addition, a backlight, serving as an illuminating device, is provided on the outside of the active matrix substrate 1 (on the rear surface of the panel) when a liquid crystal display device is of a transmissive or transflective type.

Moreover, a laminated structure of a color filter layer formed by arranging colored members and a counter electrode composed of a flat transmissive conductive film is provided on the inside of the counter substrate 50 (a surface thereof facing the active matrix substrate 1). In addition, an alignment film is formed on the inner surface of the counter substrate 50 (for example, the surface of the counter electrode), and a retardation plate or a polarizing plate may be provided thereon, if necessary.

In addition, the liquid crystal layer sealed between the active matrix substrate 1 and the counter substrate 50 is mainly composed of liquid crystal molecules. Any type of liquid crystal molecules, such as nematic liquid crystal molecules or smectic liquid crystal molecules, may be used as the liquid crystal molecules constituting the liquid crystal layer as long as they can be arranged. In a case of a TN-type liquid crystal panel, it is preferable to use nematic liquid crystal, such as phenylcyclohexane derivative liquid crystal, biphenyl derivative liquid crystal, byphenylcyclohexane derivative liquid crystal, terphenyl derivative liquid crystal, phenyl ether derivative liquid crystal, phenyl ester derivative liquid crystal, bicyclohexane derivative liquid crystal, azomethine derivative liquid crystal, azoxy derivative liquid crystal, pyrimidine derivative liquid crystal, dioxane derivative liquid crystal, or cubane derivative liquid crystal.

In the liquid crystal display device 100 having the above-mentioned structure, light emitted from the backlight is modulated in the liquid crystal layer by controlling the alignment state of the liquid crystal according to a voltage applied, thereby displaying a gray-scale image. In addition, a color image can be displayed by mixing the three primary colors R, G, and B in every pixel.

Further, in the liquid crystal display device 100, the active matrix substrate 1 is characterized in that the gate electrodes, the pixel electrodes, the capacitor lines, the source lines, and the gate lines are arranged on the same surface of the substrate, in the first layer closest to the surface of the substrate. Therefore, the liquid crystal display device 100 makes it possible to achieve a simple manufacturing process and a reduction in the amount of materials used.

Method of Manufacturing Active Matrix Substrate and Method of Discharging Liquid Next, an example of a method of manufacturing the active matrix substrate 1 and a liquid droplet discharging method, which is an example of the liquid phase method, will be described with reference to the drawings.

Liquid Droplet Discharging Device

First, a liquid droplet discharging device used for a plurality of processes of this manufacturing method will be described. In this manufacturing method, ink (liquid material) containing conductive minute particles is discharged in the form of liquid droplets from nozzles of a liquid droplet discharging head provided in the liquid droplet discharging device to form conductive members and electrodes constituting the active matrix substrate (liquid droplet discharging method). For example, the liquid droplet discharging device shown in FIGS. 5A and 5B can be used in this embodiment.

Figure 5A:
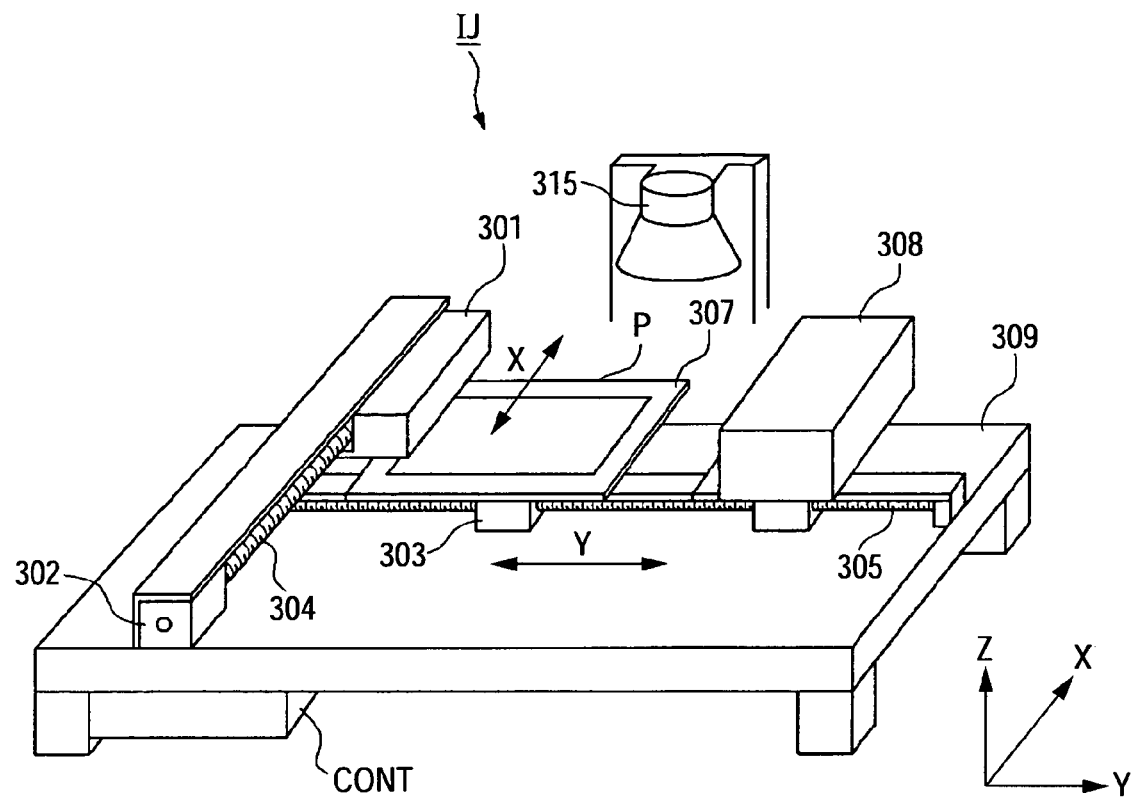
FIG. 5A is a diagram illustrating an example of a liquid droplet discharging device.

FIG. 5A is a perspective view illustrating the schematic structure of a liquid droplet discharging device IJ used for this embodiment.

The liquid droplet discharging device IJ includes a liquid droplet discharging head 301, an X-axis-direction driving shaft 304, a Y-axis-direction guide shaft 305, a control device CONT, a stage 307, a cleaning mechanism 308, a table 309, and a heater 315.

The stage 307 supports the substrate P having the ink (liquid material) discharged thereon by the liquid droplet discharging device IJ, and includes a fixing mechanism (not shown) for fixing the substrate P to a reference position.

The liquid droplet discharging head 301 is a multi-nozzle-type liquid droplet discharging head having a plurality of discharging nozzles, and a longitudinal direction thereof is the Y-axis direction. The plurality of discharging nozzles are provided in the lower surface of the liquid droplet discharging head 301 so as to extend in the Y-axis direction at predetermined intervals. The ink containing the conductive minute particles is discharged from the discharging nozzles of the liquid droplet discharging head 301 onto the substrate P supported by the stage 307.

An X-axis-direction driving motor 302 is connected to the X-axis-direction driving shaft 304. The X-axis-direction driving motor 302 is composed of, for example, a stepping motor. When receiving an X-axis-direction driving signal from the control device CONT, the X-axis-direction driving motor 302 rotates the X-axis-direction driving shaft 304. When the X-axis-direction driving shaft 304 is rotated, the liquid droplet discharging head 301 is moved in the X-axis direction.

The Y-axis-direction guide shaft 305 is fixed to the table 309 so as not to move thereon. The stage 307 includes a Y-axis-direction driving motor 303. The Y-axis-direction driving motor 303 is composed of, for example, a stepping motor. When receiving a Y-axis-direction driving signal from the control device CONT, the Y-axis-direction driving motor 303 moves the stage 307 in the Y-axis direction.

The control device CONT supplies a droplet discharge control voltage to the liquid droplet discharging head 301. In addition, the control device CONT supplies a driving pulse signal for controlling the movement of the liquid droplet discharging head 301 in the X-axis direction to the X-axis-direction driving motor 302 and a driving pulse signal for controlling the movement of the stage 307 in the Y-axis direction to the Y-axis-direction driving motor 303.

The cleaning mechanism 308 functions to clean the liquid droplet discharging head 301. The cleaning mechanism 308 is provided with a Y-axis-direction driving motor (not shown). The driving of the Y-axis direction driving motor causes the cleaning mechanism to move along the Y-axis-direction guide shaft 305. The movement of the cleaning mechanism 308 is also controlled by the control device CONT.

The heater 315 is a member for performing a thermal treatment on the substrate P by using lamp annealing, and evaporates and dries a solvent contained in the liquid material applied onto the substrate P. The heater 315 is also turned on or off by the control device CONT.

The liquid droplet discharging device IJ moves the liquid droplet discharging head 301 relative to the stage 307 supporting the substrate P to discharge liquid droplets onto the substrate P. In the following description, the X-axis direction and the Y-axis direction perpendicular to the X-axis direction are referred to as a scanning direction and a non-scanning direction, respectively. Therefore, the discharging nozzles of the liquid droplet discharging head 301 are provided in the Y-axis direction, which is the non-scanning direction, at predetermined intervals. In FIG. 5A, the liquid droplet discharging head 301 is arranged perpendicular to the moving direction of the substrate P. However, the liquid droplet discharging head 301 may be arranged so as to intersect the moving direction of the substrate P. In this way, it is possible to adjust pitches between the nozzles by adjusting the arrangement angle of the liquid droplet discharging head 301. In addition, a distance between the substrate P and a nozzle surface may be arbitrarily set.

Figure 5B:
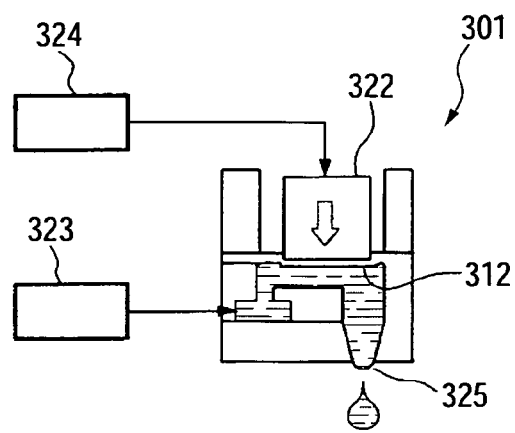
FIG. 5B is a schematic diagram illustrating a discharge head.
Figure 13A:
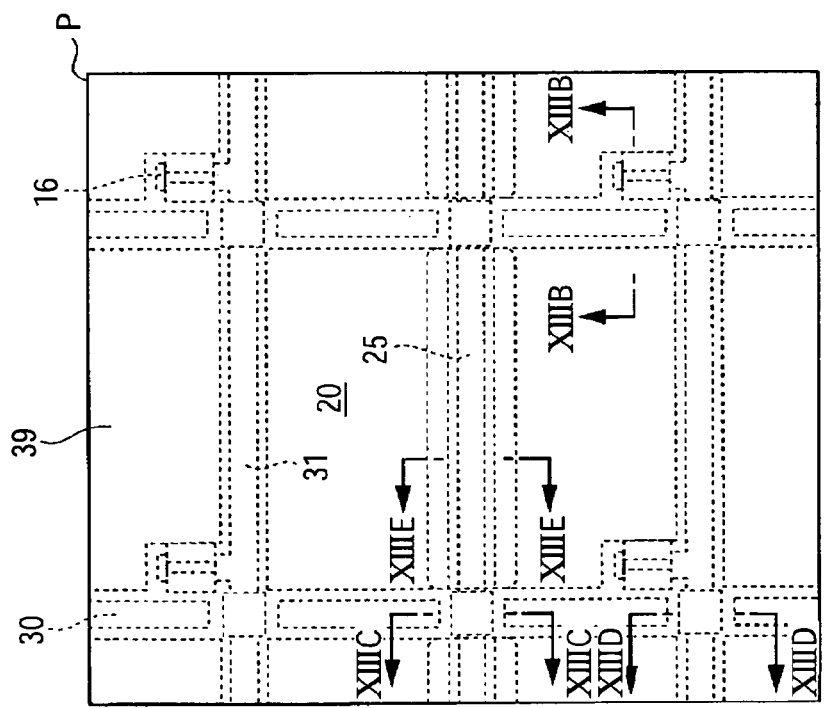
FIGS. 13A to 13E are diagrams illustrating the method of manufacturing the active matrix substrate.
Figure 13B:
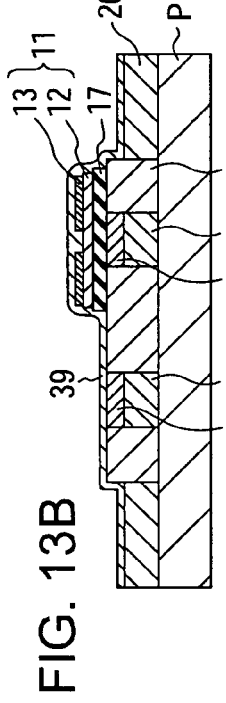
Figure 13C:
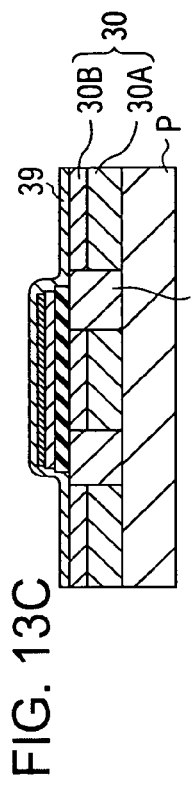
Figure 13D:
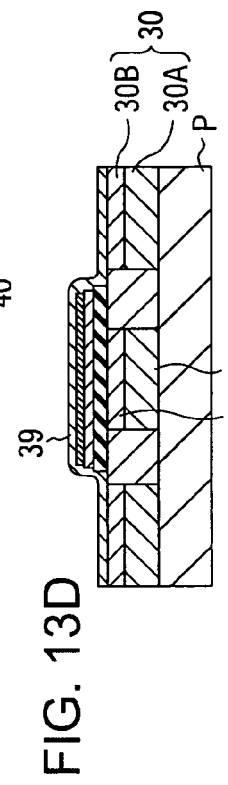
Figure 13E:
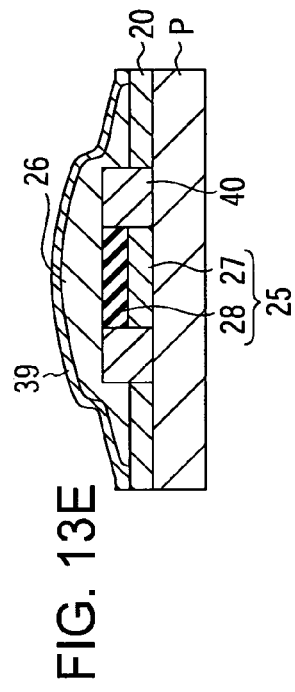

FIG. 5B is a schematic diagram of the liquid droplet discharging head illustrating a principle of discharging a liquid material by a piezoelectric method.

In FIG. 5B, a piezoelectric element 322 is arranged adjacent to a liquid chamber 321 containing the liquid material (ink; functional liquid material). The liquid material is supplied to the liquid chamber 321 through a liquid material supply line 323 including a material tank containing the liquid material. The piezoelectric element 322 is connected to a driving circuit 324. A voltage is applied to the piezoelectric element 322 through the driving circuit 324 to deform the piezoelectric element 322, thereby elastically deforming the liquid chamber 321. Then, a variation in volume when the liquid chamber 321 is elastically deformed causes the liquid material to be discharged from the nozzles 325. In this case, the degree of deformation of the piezoelectric element 322 can be controlled by varying the value of a voltage applied. Also, by varying the frequency of the applied voltage, the amount of distortion of the piezoelectric element 322 is controlled. In addition, it is possible to control the distortion speed of the piezoelectric element 322 by varying the frequency of the voltage applied. Since the piezoelectric liquid droplet discharging method does not apply heat to the material, it has an advantage in that the composition of the material is not affected.

Ink (Liquid Material)

Next, ink (liquid material) which is used for the manufacturing method of the invention and is suitable for the liquid droplet discharging head 301 will be described.

The ink (liquid material) forming a conductive member, used for this embodiment, is composed, for example, of a dispersion solution obtained by dispersing conductive minute particles in a dispersion medium or a precursor thereof. The conductive minute particles include minute particles of metallic materials, such as gold, silver, copper, palladium, niobium, and nickel; particles of precursors, alloys, and oxides of the metallic materials; and particles of conductive polymer and indium tin oxide. For example, an organic material may be coated on these conductive minute particles in order to improve dispersibility. It is preferable that the conductive minute particles have a diameter in the range of 1 nm to 0.1 μm. When the diameter of the particle is larger than 0.1 μm, the nozzles of the liquid droplet discharging head 301 may be plugged, and the minuteness of a film to be formed may be deteriorated. On the other hand, when the diameter of the particle is smaller than 1 nm, the volume ratio of a coating agent to the conductive minute particle increases, which results in an excessively large percentage of an organic material in a film to be obtained.

Any dispersion medium may be used as long as it can disperse the above-mentioned conductive particles without agglutination. For example, the dispersion media include, in addition to water, alcohols, such as methanol, ethanol, propanol, and butanol; a hydrocarbon-based compound, such as n-heptane, n-octane, decane, dodecane, tetradecane, toluene, xylene, cymene, durene, indene, dipentene, tetrahydronaphthalene, decahydronaphthalene, and cyclohexylbenzene; an ether-based compound, such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1,2-dimethoxyethane, bis(2-methoxyethyl)ether, and p-dioxane; and a polar compound, such as propylene carbonate, γ-butyrolactone, N-methyl-2-pyrrolidone, dimethylformamide, dimethylsulfoxide, and cyclohexanone. From the viewpoint of the dispersibility of the minute particles, the stability of the dispersion solution, and easy applicability to a liquid droplet discharging method (an inkjet method), preferably, water, alcohol, the hydrocarbon-based compound, and the ether-based compound are used as the dispersion media. More preferably, water and the hydrocarbon-based compound are used as the dispersion media.

Further, it is preferable that the dispersion solution of the conductive minute particles have a surface tension of 0.02 N/m to 0.07 N/m. In a case in which liquid droplets are discharged by the inkjet method, when the surface tension is smaller than 0.02 N/m, wettability of an ink composition with respect to the nozzle surface is raised so that the discharge direction tends to deviate. On the other hand, when the surface tension exceeds 0.07 N/m, the shape of the meniscus at the tip of the nozzle becomes unstable, making it difficult to control the discharge amount and the discharge timing. In order to adjust the surface tension, a preferable way is to add a small amount of surface tension adjusting agent, such as a fluorine-based, silicon-based, or nonionic surface tension agent, into the above-mentioned dispersion solution to an extent not to largely decrease the contact angle with the substrate. The nonionic surface tension adjusting agent improves the wettability of liquid on the substrate and the leveling property of the film, and thus prevents the occurrence of minute unevenness on the film. The above-mentioned surface tension adjusting agent may contain organic compounds, such as alcohol, ether, ester, and ketone, if necessary.

The viscosity of the dispersion solution is preferably in a range of 1 mPa·s to 50 mPa·s. In a case in which a liquid material is discharged in the form of liquid droplets by the inkjet method, if the viscosity is lower than 1 mPa·s, the area around the nozzle is easily contaminated by the discharged ink. On the other hand, if the viscosity is higher than 50 mPa·s, the nozzles are frequently clogged, which makes it difficult to smoothly discharge liquid droplets, resulting in a reduction in the discharge amount of liquid.

Method of Manufacturing Active Matrix Substrate

Hereinafter, a method of manufacturing the active matrix substrate 1 will be described with reference to FIGS. 6A to 15C. FIGS. 6A to 15C are diagrams illustrating an example of the method of manufacturing the active matrix substrate 1 and each of them includes a plan view and a cross-sectional view.

Process for Forming First Bank Layer

First, as shown in FIGS. 6A and 6B, the banks 40 are formed on one surface of the substrate P, which is a base.

The substrate P can be formed of various materials, such as glass, quartz glass, an Si wafer, a plastic film, and a metal film. In additional, the substrate P includes substrates obtained by forming, for example, a semiconductor layer, a metal layer, a dielectric layer, and an organic layer, as base layers, on base substrates formed of these various materials.

The banks 40 are members for partitioning the surface of the substrate in plan view. The banks 40 may be formed by, for example, a photolithography method or a printing method. For example, if the photolithography method is used, an organic photosensitive material, such as an acrylic resin, is coated onto the substrate P so as to match the height of the banks by a predetermined method, such as a spin coating method, a spray coating method, a roll coating method, a dye coating method, or a dip coating method, thereby forming a photosensitive material layer. Then, ultraviolet rays are radiated onto the photosensitive material layer, matching the shape of the banks, thereby forming the banks 40 having the openings 40a, 40b, 40c, 40d, and 40e. The banks 40 are formed of a polymer material, such as an acryl-based resin, a polyimide based resin, an olefin-based resin, or a melamine-based resin. The bank 40 may be formed of an inorganic structure formed of, for example, a liquid material including poly silazane.

The openings 40a, 40b, 40c, 40d, and 40e of the banks 40 correspond to the gate electrodes, the pixel electrodes, the capacitor lines, the source lines, and the gate lines, respectively.

More specifically, the openings 40c and 40e formed to extend in the horizontal direction of the drawings correspond to the forming positions of the gate lines and the capacitor lines. The openings 40d formed in the vertical direction so as to intersect the openings 40c and 40e correspond to the forming positions of the source lines. The openings 40d for the source lines are separated from the openings 40c for the capacitor lines and the openings 40e for the gate lines at the intersection points therewith so as not to be connected to them. The openings 40a which are branched from each opening 40e for the gate line so as to extend in the vertical direction of the drawings correspond to the forming positions of the gate electrodes. In addition, each opening 40b surrounded in a lattice shape by the openings 40d for the source lines, the opening 40e for the gate line, and the opening 40c for the capacitor line corresponds to the pixel electrode.

Next, a lyophobic treatment is performed on the banks 40 in order to improve the arrangement of the ink, which is a liquid material, into the openings 40a, 40b, 40c, 40d, and 40e, if necessary.

For example, a plasma processing method (i.e., a $CF_4$ plasma processing method) using tetrafluoromethane as a raw gas under atmosphere can be employed as the lyophobic treatment. The $CF_4$ plasma processing method is performed under the following conditions: for example, a plasma power of 50 kW to 1000 kW, a tetrafluoromethane gas flow rate of 50 ml/min to 100 ml/min, a transporting speed of the substrate P relative to a plasma discharge electrode of 0.5 mm/sec to 1020 mm/sec, and a substrate temperature of 70 to 90° C. Note that the raw gas is not restricted to tetrafluoromethane (tetrafluorocarbon), but other fluorocarbon-based gases may be used as the raw gas.

The lyophobic treatment causes a fluorine base to be introduced into the resin forming the banks 40, and thus a high degree of repellency is imparted to the banks 40.

Further, an ashing process using $O_2$ plasma or a UV (ultraviolet) radiation process is performed to clean the surface of the substrate P exposed from the bottoms of the openings 40a, 40b, 40c, 40d, and 40e before the banks 40 are formed, if necessary. This process makes it possible to remove the remains of the banks on the surface of the substrate P, to increase a difference between the contact angle of the banks 40 and the contact angle of the surface of the substrate after the lyophobic treatment, and to accurately arrange liquid droplets into the openings of the banks 40 in the subsequent process. In addition, in a case in which the banks 40 are formed of an acrylic resin or polyimide resin, the banks 40 are fluoridated easier (i.e., made liquid repellent) when they are exposed to $O_2$ plasma before the $CF_4$ plasma processing. Therefore, when the banks 40 are formed of the resin material, it is preferable to perform the $O_2$ plasma processing before the $CF_4$ plasma processing.

More specifically, the $O_2$ ashing process is performed by radiating plasma-state oxygen from the plasma discharge electrode onto the substrate P. The $O_2$ ashing process is performed under the following conditions: for example, a plasma power of 50 W to 1000 W, an oxygen gas flow rate of 50 ml/min to 100 ml/min, a transporting speed of the substrate P relative to the plasma discharge electrode of 0.510 mm/sec to 10 mm/sec, and a substrate temperature of 70 to 90° C.

The lyophobic treatment (the $CF_4$ plasma processing) on the banks 40 has a relatively small effect on the lyophilic surface of the substrate P by the removing process performed beforehand. In particular, if the substrate P is formed of, for example, glass, the fluorine base is hardly introduced into the substrate P due to the lyophobic treatment so that, essentially, the lyophilic property, that is, wettability of the substrate P is not damaged. In addition, when the banks 40 are formed of a lyophobic material (for example, a resin material having a fluorine base), the lyophobic treatment may not be performed.

Process for Forming Gate Electrode, Source Line, and Gate Line

Next, as shown in FIGS. 7A and 7B, the gate electrodes 16, the source lines 30, and the gate lines 31 are formed on the substrate P.

A process for forming the gate electrodes 16, a process for forming the source lines 30, and a process for forming the gate lines 31 are simultaneously performed with the material arranging process and the process for performing a thermal treatment on the material film.

More specifically, first, an ink material is discharged from the liquid droplet discharging head 301 (FIGS. 5A and 5B) of the liquid droplet discharging device IJ into the openings 40a, 40d, and 40e of the banks 40 to form the gate electrodes 16, the source lines 30, and the gate lines 31. In this embodiment, the gate electrodes 16, the source lines 30, and the gate lines 31 are made of the same material, and each of them is formed of a laminated structure of two layers. For example, an ink material containing Ag (silver), serving as the conductive minute particles, and diethylene glycol diethylether, serving as a solvent (a dispersion medium) is used to form a lower layer (a base layer). At the time when the ink material is discharged to form the base layer, if the surfaces of the banks 40 have a lyophobic property and the bottoms of the openings exposed from the surface of the substrate have a lyophilic property, some of the liquid droplets discharged on the banks 40 are repelled from the surfaces of the banks to flow into the openings.

After the material is arranged onto the base layer, a drying process is performed, if necessary, to remove the dispersion medium. The drying process may be performed by heating the substrate P using, for example, a normal hot plate or an electric furnace. The drying process is performed under the conditions of, for example, a heating temperature of 180° C. and a heating time of about sixty minutes. The heating is not necessarily performed under atmosphere, such as a nitrogen gas atmosphere.

The drying process may be performed by lamp annealing. A light source used for the lamp annealing is not particularly limited to a specific light source. For example, an infrared lamp, a xenon lamp, a YAG laser, an argon laser, a carbon dioxide gas laser, and excimer lasers using, for example, XeF, XeCl, XeBr, KrF, KrCl, ArF, and ArCl can be used as the light source. The light sources having an output range of 10 W to 5000 W are generally used. However, one in a range of 100 W to 1000 W is preferable for this embodiment.

An ink material containing Ni (nickel), serving as the conductive minute particles, and water or diethanolamine, serving as a solvent (a dispersion medium) is used to form an upper layer (covering layer) on the gate electrode 16, the source lines 30, and the gate lines 31.

Further, at the time when the ink material is discharged to form the covering layer, if the surfaces of the banks 40 have a lyophobic property, some of the liquid droplets discharged on the banks 40 are repelled from the surfaces of the banks to flow into the openings. However, since the surface of the base layer previously formed inside the openings 40a, 40d, and 40e does not have a strong attraction for the ink material applied in this process, an intermediate layer may be formed to improve the wettability of the ink on the base layer, before the ink forming the covering layer is applied. This intermediate layer is appropriately selected according to the kind of the dispersion medium constituting the ink forming the covering layer. However, when the ink uses a water-based dispersion medium, an intermediate layer is formed of, for example, a titanium oxide to obtain very high wettability on the surface of the intermediate layer.

After the ink material is discharged to form the covering layer, a drying process is performed, if necessary, to remove the dispersion medium. The drying process may be performed by heating the substrate P using, for example, a normal hot plate or an electric furnace. The drying process is performed under the conditions of, for example, a heating temperature of 180° C. and a heating time of about sixty minutes. The heating is not necessarily performed under atmosphere, such as a nitrogen gas atmosphere.

The drying process may be performed by lamp annealing. The same light source as used for the base layer is used. The light source generally may have an output range of 100 W to 1000 W, similar to the heating process.

Subsequently, a baking process (a thermal treatment and/or an optical treatment) is performed on the dried base and covering layers.

When a coating agent, such as an organic material, is coated on the surfaces of the conductive minute particles in order to improve electrical contact between the minute particles, to completely remove the dispersion medium, and to improve the dispersibility of the solution, the baking process is performed to remove the coating agent.

The heat treatment and/or the optical treatment are normally carried out in atmosphere, but they may be performed in an inert gas atmosphere, such as nitrogen, argon, or helium, if necessary. The treatment temperature of the heat treatment and/or the optical treatment is correspondingly determined by taking into account, for example, the boiling point (vapor pressure) of the diffusion medium, the type and pressure of the atmosphere gas, the thermal characteristics, such as dispersibility and oxidization, of the minute particles, the presence or absence of the coating material and the amount thereof if present, and the heat resistance temperature of the substrate. Further, in this stage, since the semiconductor layer is not provided on the substrate P, it is possible to increase the baking temperature within the heat resistance temperature range of the banks 40. For example, the baking process can be performed at a baking temperature of 250° C. or more, or about 300° C., which makes it possible to form metal wiring lines having desirable conductivity.

In this way, electrical contact between the minute particles in the dried films of the base layer and the covering layer is ensured by the baking process, so that the dried films are converted into conductive films. As a result, the gate electrode 16, the source line 30, and the gate line 31, each having a two-layer structure, are formed in the openings 40a, 40d, and 40e of the banks 40, respectively.

Further, in this embodiment, the lower layer (the base layer) made of Ag and the upper layer (the covering layer) made of Ni are formed, and the gate electrode 16, the source line 30, and the gate line 31 are formed of a laminated structure of the base layer and the covering layer. However, the base layer may be formed of metallic materials other than Ag. For example, the base layer may be formed of Cu or Al, or an alloy having these metallic materials as main ingredients. In addition, the covering layer may be formed of metallic materials other than Ni. For example, the covering layer may be formed of Ti, W, or Mn, or an alloy having these metallic materials as main ingredients. Further, the structure of the components is not limited to the two-layer structure. In addition, the baking process may be performed on each laminated film.

Process for Forming Pixel Electrode and Capacitor Line

Next, as shown in FIGS. 7A and 7B, the pixel electrodes 20 and the capacitor lines 27 are formed on the substrate P.

A process for forming the pixel electrodes 20 and a process for forming the capacitor lines 27 are simultaneously performed with the material arranging process and the process for performing a thermal treatment on the material film.

More specifically, first, an ink material is discharged from the liquid droplet discharging head 301 (FIGS. 5A and 5B) of the liquid droplet discharging device IJ into the openings 40b and 40c of the banks 40 to form the pixel electrodes 20 and the capacitor lines 27. In this embodiment, the pixel electrodes 20 and the capacitor lines 27 are formed of the same material, such as an ink material obtained by dispersing minute particles of a transmissive conductive material, such as ITO, IZO, or FTO, into a solvent (a dispersion medium). The pixel electrodes 20 and the capacitor lines 27 may be formed of other materials, such as a liquid material containing ITO minute particles and an organic silicon compound and a liquid material containing ITO minute particles, an organic indium compound, and an organic tin compound. The use of these liquid materials makes it possible to form a transmissive conductive film having a structure in which the ITO minute particles are firmly adhered to each other by a matrix of $SiO_2$ or ITO generated from the organic metal compound and to closely arrange the ITO minute particles at a relative low baking temperature, thereby forming a transmissive conductive film having good electrical connection between the minute particles. At the time when the ink material is discharged, if the surfaces of the banks 40 have a lyophobic property and the bottoms of the openings exposed from the surface of the substrate have a lyophilic property, some of the liquid droplets discharged on the banks 40 are repelled from the surfaces of the banks to flow into the openings.

After the material forming the pixel electrodes 20 and the capacitor lines 27 is arranged, a drying process is performed necessary, to remove the dispersion medium. The drying process may be performed by heating the substrate P using, for example, a normal hot plate or an electric furnace. The drying process is performed under the conditions of, for example, a heating temperature of 180° C. and a heating time of about sixty minutes. The heating is not necessarily performed under atmosphere, such as a nitrogen gas atmosphere.

The drying process may be performed by lamp annealing. A light source used for the lamp annealing is not particularly limited to a specific light source. For example, an infrared lamp, a xenon lamp, a YAG laser, an argon laser, a carbon dioxide gas laser, and excimer lasers using, for example, XeF, XeCl, XeBr, KrF, KrCl, ArF, and ArCl can be used as the light source. The light sources having an output range of 10 W to 5000 W are generally used. However, one in a range of 100 W to 1000 W is preferable for this embodiment.

Subsequently, a baking process (a thermal treatment and/or an optical treatment) is performed on the dried films of the pixel electrodes 20 and the capacitor lines 27.

When a coating agent, such as an organic material, is coated on the surfaces of the conductive minute particles in order to improve electrical contact between the minute particles, to completely remove the dispersion medium, and to improve the dispersibility of the solution, the baking process is performed to remove the coating agent.

The heat treatment and/or the optical treatment are normally carried out in atmosphere, but they may be performed in an inert gas atmosphere, such as nitrogen, argon, or helium, if necessary. The treatment temperature of the heat treatment and/or the optical treatment is correspondingly determined by taking into account, for example, the boiling point (vapor pressure) of the diffusion medium, the type and pressure of the atmosphere gas, the thermal characteristics, such as dispersibility and oxidization, of the minute particles, the presence or absence of the coating material and the amount thereof if present, and the heat resistance temperature of the substrate. Further, in this stage, since the semiconductor layer is not provided on the substrate P, it is possible to increase the baking temperature within the heat resistance temperature range of the banks 40. For example, the baking process can be performed at a baking temperature of 250° C. or more, or about 300° C., which makes it possible to form a transmissive conductive film having desirable conductivity.

In this way, electrical contact between the minute particles in the dried films of the pixel electrodes 20 and the capacitor lines 27 is ensured by the baking process, so that the dried films are converted into transmissive conductive films. As a result, the pixel electrode 20 and the capacitor line 27 are formed in the openings 40b and 40c of the banks 40, respectively.

The thermal treatment of the gate electrodes 16, the source lines 30, and the gate lines 31 can be simultaneously performed with the thermal treatment of the pixel electrodes 20 and the capacitor lines 27. Alternatively, the above-mentioned thermal treatments can be simultaneously performed with the subsequent thermal treatment of the capacitors 25 and the auxiliary electrodes 26 (FIGS. 9A and 9B). In addition, the pixel electrodes 20 and the capacitor lines 27 may be formed before the gate electrodes 16, the source lines 30, and the gate lines 31 are formed.

Process for Forming Capacitor Insulating Film

Next, as shown in FIGS. 8A and 8B, the insulating film 28 constituting the capacitors 25 is formed on the capacitor lines 27.

More specifically, the material forming the insulating film 28 is applied on the capacitor lines 27 in the openings 40c of the banks 40, and is then hardened. It is preferable that the insulating film 28 of the capacitor 25 be formed of an organic resin having an insulating property and a transmissive property after hardening, such as polysilazane (which is a general term of a polymer having an Si—N coupling), acryl, polyimide, polyamide, or BCB (benzocyclobutene).

An example of the polysilazane is $[SiH_2NH]_n$ (n is a positive integer) which is called polyperhydrosilazane. When the H of $[SiH_2NH]_n$ is substituted for an alkyl group (for example, a methyl group or an ethyl group), $[SiH_2NH]_n$ is converted into organic polysilazane, which is distinguished from inorganic polysilazane. A liquid material obtained by mixing polysilazane with a solvent, such as xylene, is converted into a silicon oxide by a thermal treatment in atmosphere including vapor or oxygen. The polysilazane has high crack resistance or oxygen-plasma resistance, and can be used as a thick insulating film. The liquid material can be applied by, for example, a dispenser method or a liquid droplet discharging method. At the time when the liquid material is discharged, if the surfaces of the banks 40 have a lyophobic property, some of the liquid droplets discharged on the banks 40 are repelled from the surfaces of the banks to flow into the openings.

Subsequently, a baking process (a thermal treatment and/or an optical treatment) is performed on the material film.

For example, a thermal treatment is performed on the material film containing polysilazane and xylene in the vapor atmosphere at a temperature of 100 to 350° C. for 10 to 60 minutes to form a silicon oxide film. After the thermal treatment, a thermal treatment is further performed thereon at a temperature of 400 to 500° C. for 30 to 60 minutes, or laser annealing or lamp annealing is performed thereof at a high temperature for a short time, thereby improving the minuteness of the insulating film.

Process for Forming Auxiliary Electrode of Capacitor

Next, as shown in FIGS. 9A and 9B, the auxiliary electrode 26 constituting the capacitor 25 is formed on the insulating film 28 laminated on the capacitor line 27.

More specifically, the material forming the auxiliary electrode 26 is applied so as to cover a portion of the pixel electrode 20, the insulating film 28, and a portion of the bank 40, and is then hardened. Preferably, the auxiliary electrode 26 is formed of the same material as that forming the pixel electrode 20. For example, the auxiliary electrode 26 is formed of an ink material obtained by dispersing minute particles of a transmissive conductive material, such as ITO, IZO, or FTO, into a solvent (a dispersion medium). Alternatively, the auxiliary electrode 26 may be formed of other materials, such as a liquid material containing ITO minute particles and an organic silicon compound and a liquid material containing ITO minute particles, an organic indium compound, and an organic tin compound. The use of these liquid materials makes it possible to form a transmissive conductive film having a structure in which the ITO minute particles are firmly adhered to each other by a matrix of $SiO_2$ or ITO generated from the organic metal compound and to closely arrange the ITO minute particles at a relative low baking temperature, thereby forming a transmissive conductive film having good electrical connection between the minute particles.

After the material forming the auxiliary electrode 26 is applied, a drying process is performed, if necessary, to remove the dispersion medium. The drying process can be performed by heating the substrate P using, for example, a normal hot plate or an electric furnace, similar to the drying process performed on the pixel electrode 20. The drying process is performed under the conditions of, for example, a heating temperature of 180° C. and a heating time of about sixty minutes. The heating is not necessarily performed under atmosphere, such as a nitrogen gas atmosphere.

The drying process may be performed by lamp annealing. A light source used for the lamp annealing is not particularly limited to a specific light source. For example, an infrared lamp, a xenon lamp, a YAG laser, an argon laser, a carbon dioxide gas laser, and excimer lasers using, for example, XeF, XeCl, XeBr, KrF, KrCl, ArF, and ArCl can be used as the light source. The light sources having an output range of 10 W to 5000 W are generally used. However, one in a range of 100 W to 1000 W is preferable for this embodiment.

Subsequently, a baking process (a thermal treatment and/or an optical treatment) is performed on the dried films of the auxiliary electrodes 26.

Similar to the baking process performed on the pixel electrode 20, the baking process is normally carried out in atmosphere, but they may be performed in an inert gas atmosphere, such as nitrogen, argon, or helium, if necessary. The treatment temperature of the heat treatment and/or the optical treatment is correspondingly determined by taking into account, for example, the boiling point (vapor pressure) of the diffusion medium, the type and pressure of the atmosphere gas, the thermal characteristics, such as dispersibility and oxidization, of the minute particles, the presence or absence of the coating material and the amount thereof if present, and the heat resistance temperature of the substrate. Further, in this stage, since the semiconductor layer is not provided on the substrate P, it is possible to increase the baking temperature within the heat resistance temperature range of the banks 40. For example, the baking process can be performed at a baking temperature of 250° C. or more, or about 300° C., which makes it possible to form a transmissive conductive film having good conductivity.

In this way, electrical contact between the minute particles in the dried films of the auxiliary electrodes 26 is ensured by the baking process, so that the dried films are converted into transmissive conductive films. As a result, the auxiliary electrode 26 is formed to cover a portion of the pixel electrode 20, the insulating film 28, and a portion of the bank 40, so that it is opposite to the capacitor line 27 with the insulating film 28 interposed therebetween and is also electrically connected to the pixel electrode 20.

As described above, the thermal treatment of the gate electrodes 16, the source lines 30, and the gate lines 31, the thermal treatment of the pixel electrodes 20 and the capacitor lines 27, and the thermal treatment of the auxiliary electrodes 26 can be performed at the same time. Alternatively, after the pixel electrodes 20, the capacitor lines 27, and the auxiliary electrodes 26 are formed, the gate electrodes 16, the source lines 30, and the gate lines 31 may be formed.

Process for Forming Gate Insulating Film and Semiconductor Layer

Next, as shown in FIGS. 10A to 10D, FIGS. 11A to 11D, and FIGS. 12A to 12E, the gate insulating film 17, the amorphous silicon layer 12, and the N$^+$ silicon layer 13 are formed on the gate electrode 16.

For example, the gate insulating film 17, the amorphous silicon layer 12, and the N$^+$ silicon layer 13 can be formed by deposition by a plasma CVD method and patterning by the subsequent photolithography method. That is, as shown in FIGS. 10A to 10D, material films for the gate insulating film 17, the amorphous silicon layer 12, and the N$^+$ silicon layer 13 are sequentially formed on the entire surface of the substrate P, and a resist film 45 for patterning is selective formed on the films, as shown in FIGS. 11A to 11D. Then, as shown in FIGS. 12A to 12E, etching is performed thereon using the resist film 45 as a mask to form a laminated structure of the gate insulating film 17, the amorphous silicon layer 12, and the N$^+$ silicon layer 13 having a predetermined pattern shape. As shown in FIGS. 11A to 11D, it is preferable that a double exposure process be performed on the resist film 45. That is, at the time of patterning, the resist film 45 having a substantially concave shape is selectively arranged on the surface of the N$^+$ silicon layer 13, and then etching is performed thereon using the resist film 45 as a mask. As shown in FIGS. 12A to 12E, this patterning causes the N$^+$ silicon layer 13 to be selectively removed in a region overlapping the gate electrode 16 in plan view, so that the N$^+$ silicon layer 13 is divided into two portions. The two portions of the N$^+$ silicon layer 13 serve as a source contact region and a drain contact region.

A raw gas for the gate insulating film 17 preferably includes a mixed gas of monosilane and dinitrogen oxide, a mixture of TEOS (tetraethoxysilane, $Si(OC_2H_5)_4$) and oxygen, and a mixture of disilane and ammonia, and the gate insulating film 17 is formed with a thickness of about 150 nm to 400 nm. Preferably, disilane or monosilane is used as a raw gas for the amorphous silicon layer 12. The process for forming the N$^+$ silicon layer 13 can be performed by introducing a raw gas for an N$^+$ silicon layer into a film forming apparatus used for forming the amorphous silicon layer 12. The amorphous silicon layer 12 is formed with a thickness of about 150 nm to 250 nm. The N$^+$ silicon layer 13 is formed with a thickness of about 50 nm to 100 nm.

Process for Forming Protective Film

Next, as shown in FIGS. 13A to 13E, the protective film 39 for protecting the semiconductor layer 11 (the amorphous silicon layer 12 and the N$^+$ silicon layer 13) is formed, if necessary. The protective film 39 has a function of preventing metal (for example, alkali metal (movable ions) passing through the bank 41 (see FIGS. 14A to 14C) to be formed in the subsequent process from being permeated into the semiconductor layer 11. When the bank 41 (see FIGS. 14A to 14C) has this function, the process for forming the protective film 39 may be omitted. The protective film 39 is formed of, for example, silicon nitride, silicon oxynitride, titanium nitride, or tantalum nitride. In addition, a method of forming the protective film 39 is appropriately selected according to a material used, and includes, for example, a CVD method, a coating method, a sputtering method, and a vapor deposition method.

Process for Forming Upper Layer Pattern

Figure 14A:
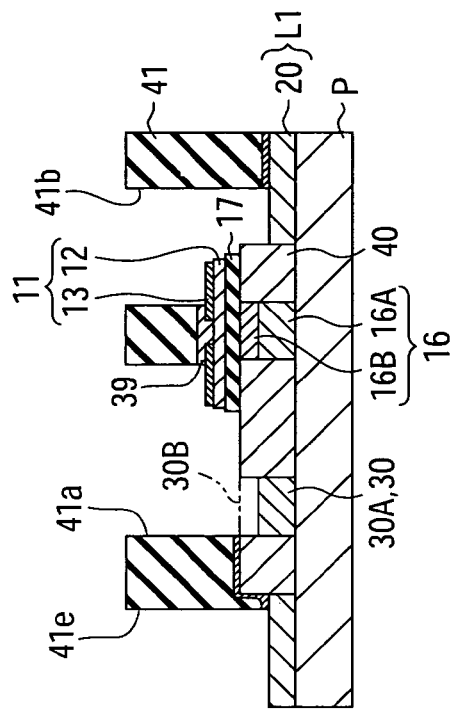
FIGS. 14A to 14C are diagrams illustrating the method of manufacturing the active matrix substrate.
Figure 14B:
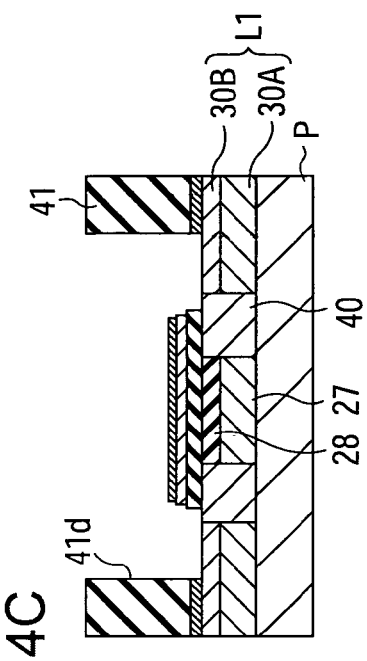
Figure 14C:
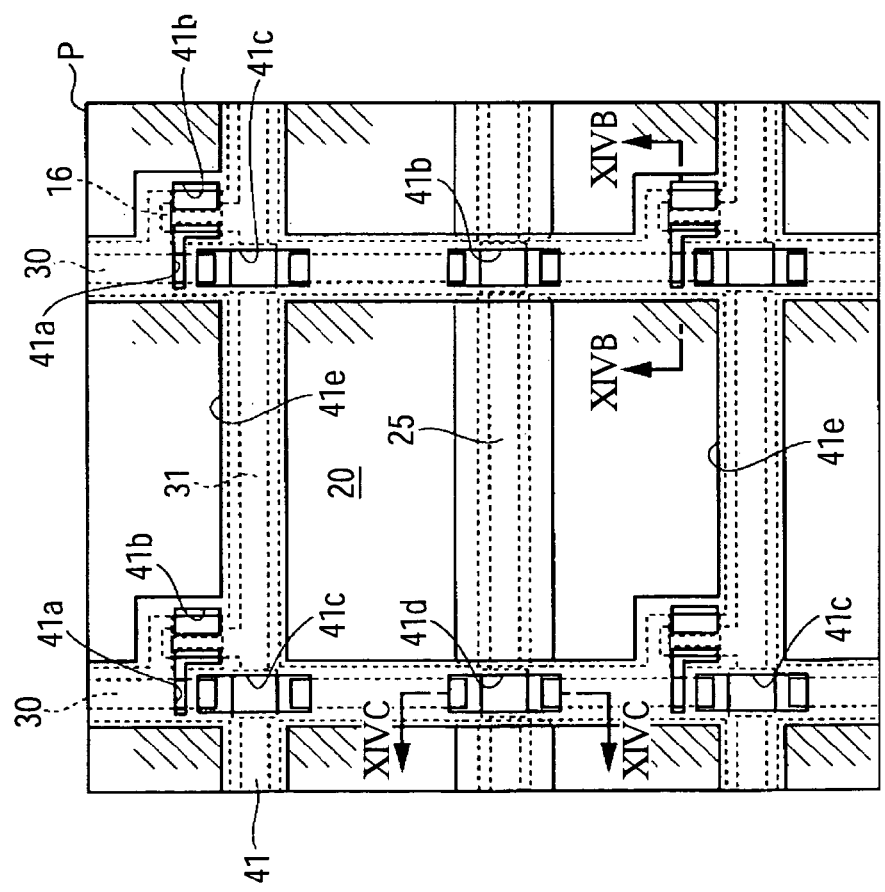

Next, as shown in FIGS. 14A to 14C, the banks 41 are formed on the first layer L1 including the banks 40.

The banks 41 are members for defining the forming regions of the source electrodes 18, the drain electrodes 19, and the auxiliary conductive films 35 and 36 (see FIG. 2 and FIGS. 15A to 15C), and the pixel electrodes 20. The banks 41 can be formed by, for example, a photolithography method or a printing method. For example, if the photolithography method is used, similar to the banks 40 of the first layer L1, an organic photosensitive material, such as an acrylic resin, is coated onto the substrate P so as to match the height of the banks by a predetermined method, such as a spin coating method, a spray coating method, a roll coating method, a dye coating method, or a dip coating method, thereby forming a photosensitive material layer. Then, ultraviolet rays are radiated onto the photosensitive material layer, matching the shape of the banks, thereby forming the banks 41 having predetermined openings 41a, 41b, 41c, 41d, and 41e. The banks 41 are formed of a polymer material, such as an acrylic resin, a polyimide resin, an olefin resin, or a melamine resin. The bank 41 may be an inorganic structure formed of, for example, a liquid material including poly silazane.

The openings 41a, 41b, 41c, 41d, and 41e of the banks 41 correspond to the source electrodes, the drain electrodes, the auxiliary conductive film, and the pixel electrodes 20, respectively.

More specifically, the opening 41a passing through a region including a portion of the source line 30 and the source region of the semiconductor layer 11 in the first layer L1 corresponds to the forming position of the source electrode, and the opening 41b passing through a region including a portion of the pixel electrode 20 and the drain region of the semiconductor layer 11 in the first layer L1 corresponds to the drain electrode. The opening 41c passing through portions of two source lines 30 which are branched from an intersection of the source line and the gate line 31 and the opening 41d passing through portions of two source lines 30 which are branched from an intersection of the source line and the capacitor line 27 correspond to the auxiliary conductive film. In addition, each opening 41d surrounded in a lattice shape by the source lines 30 and the gate lines 31 corresponds to the pixel electrode 20 including the capacitor 25.

Further, ink materials forming the source electrodes, the drain electrodes, and the auxiliary conductive film, which will be described later, are arranged in the openings 41a, 41b, 41c, and 41d, respectively.

When the protective film 39 is formed on the bottoms of the openings 41a, 41b, 41c, 41d, and 41e of the formed banks 41, the protective film 39 is removed by etching. Further, in the openings 41a, 41c, and 41d, the upper layer (the covering layer) of the source line 30 is removed by etching, thereby exposing the lower layer (the base layer) thereof.

Further, similar to the banks 40, a lyophobic treatment is performed on the banks 41 in order to improve the arrangement of ink, which is a liquid material, into the openings 41a, 41b, 41c, and 41d, if necessary.

That is, a plasma processing method (i.e., a $CF_4$ plasma processing method) using tetrafluoromethane as a raw gas in an air atmosphere can be employed as the lyophobic treatment. In addition, the raw gas is not restricted to tetrafluoromethane (tetrafluorocarbon), but other fluorocarbon-based gases can be used as the raw gas. This lyophobic treatment causes a fluorine base to be introduced into the resin constituting the banks 41, and thus a high degree of repellency is imparted to the banks 41.

Further, an ashing process using $O_2$ plasma or a UV (ultraviolet) radiation process is performed to clean the surface of the substrate P exposed from the bottoms of the openings 41a, 41b, 41c, and 41d before the banks 41 are formed, if necessary. This process makes it possible to remove the remains of the banks on the exposed surface, to increase a difference between the contact angle of the banks 41 and the contact angle of the exposed surface after the lyophobic treatment, and to accurately arrange liquid droplets into the openings of the banks 41 in the subsequent process. In addition, in a case in which the banks 41 are formed of an acrylic resin or a polyimide resin, the banks 41 are fluoridated easier (i.e., made liquid repellent) when they are exposed to $O_2$ plasma before the $CF_4$ plasma processing. Therefore, when the banks 41 are formed of the resin material, it is preferable to perform the $O_2$ plasma processing before the $CF_4$ plasma processing.

Figure 15B:
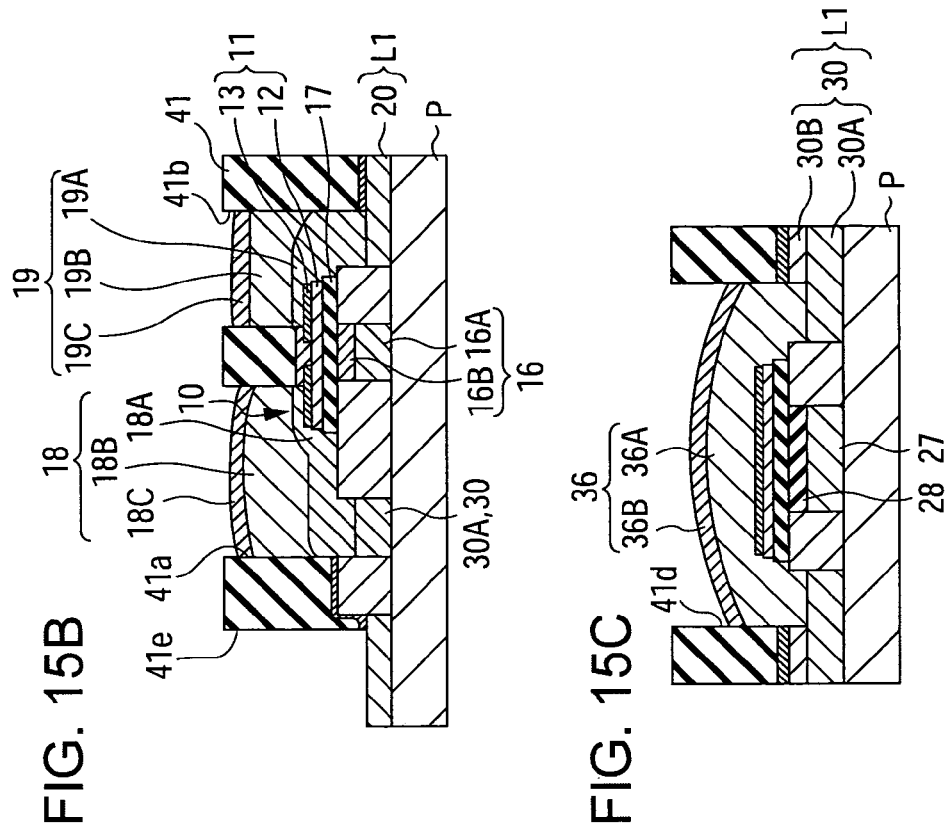
FIGS. 15A to 15C are diagrams illustrating the method of manufacturing the active matrix substrate.
Figure 15C:
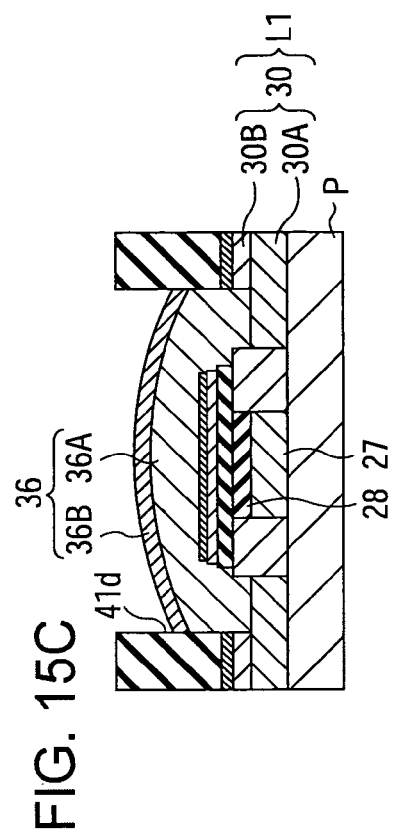
Figure 15A:
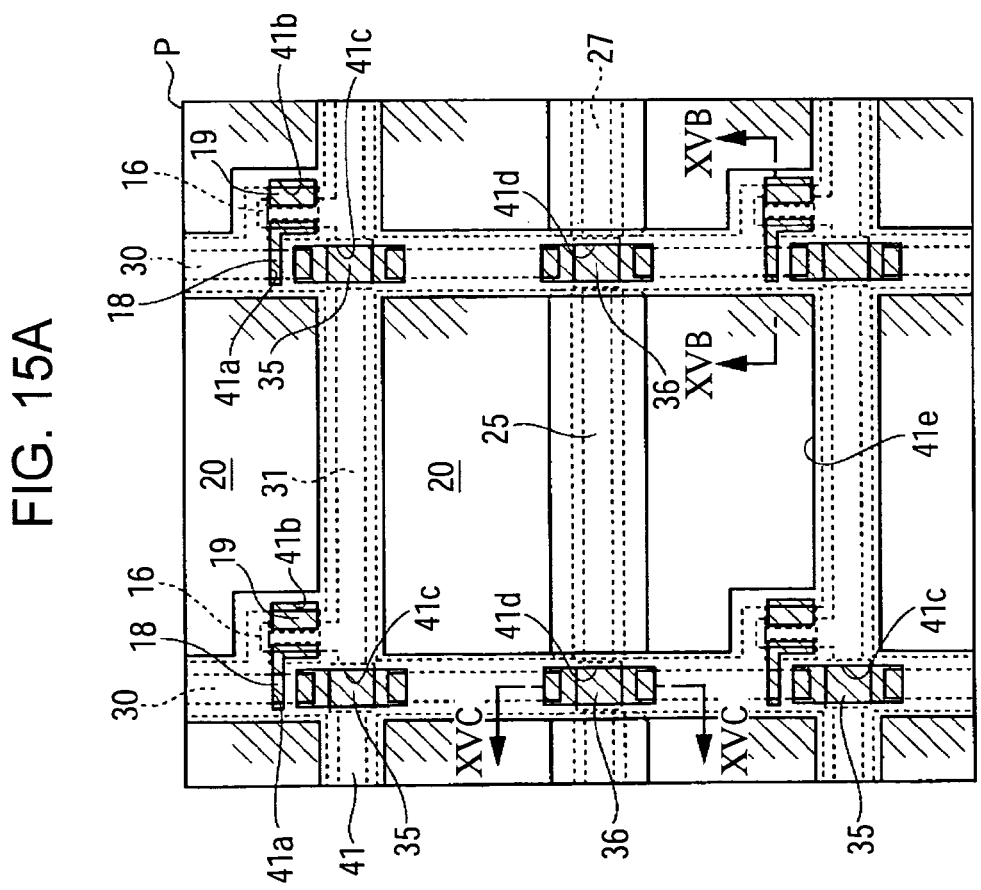

Process for Forming Source Electrode, Drain Electrode, and Auxiliary Conductive Film Next, as shown in FIGS. 15A to 15C, the source electrodes 18, the drain electrodes 19, and the auxiliary conductive films 35 and 36 are formed on the first layer L1 of the substrate P.

A process for forming the gate electrodes 16, a process for forming the source lines 30, and a process for forming the gate lines 31 are simultaneously performed with a part of the material arranging process and the process for performing a thermal treatment on the material film.

More specifically, first, ink materials are discharged from the liquid droplet discharging head 301 (FIGS. 5A and 5B) of the liquid droplet discharging device IJ into the openings 41a, 41b, 41c, and 41d provided in the banks 41 to form the source electrodes 18, the drain electrodes 19, and the auxiliary conductive films 35 and 36. In this embodiment, the source electrodes 18 and the drain electrodes 19 each have a laminated structure of three layers (a lower layer, an intermediate layer, and an upper layer), and the auxiliary conductive films 35 and 36 each has a laminated structure of two layers (an lower layer and an upper layer). In addition, the intermediate layers (base layers) of the source electrode 18 and the drain electrodes 19 and the lower layers (base layers) of the auxiliary conductive films 35 and 36 are formed of the same material, and the upper layers (covering layers) of the source electrode 18 and the drain electrodes 19 and the upper layers (covering layers) of the auxiliary conductive films 35, and 36 are formed of the same material. That is, in this forming process, the material films are laminated in the following order: (1) the lower layers (barrier layers) of the source electrode 18 and the drain electrode 19; (2) the intermediate layers (base layers) of the source electrode 18 and the drain electrode 19 and the lower layers (base layers) of the auxiliary conductive films 35 and 36; and (3) the upper layers (covering layers) of the source electrode 18 and the drain electrode 19 and the upper layers (covering layers) of the auxiliary conductive films 35 and 36.

An ink material containing Ag (silver), serving as conductive minute particles, and diethylene glycol diethylether, serving as a solvent (a dispersion medium) is used to form the barrier layers of the source electrode 18 and the drain electrode 19. At the time when the ink material is discharged, if the surfaces of the banks 41 have a lyophobic property, some of the liquid droplets discharged on the banks 41 are repelled from the surfaces of the banks to flow into the openings.

After the ink material forming the covering layers of the source electrode 18 and the drain electrode 19 is discharged, a drying process is performed, if necessary, to remove the dispersion medium. The drying process may be performed by heating the substrate P using, for example, a normal hot plate or an electric furnace. The drying process is performed under the conditions of, for example, a heating temperature of 180° C. and a heating time of about sixty minutes. The heating is not necessarily performed under atmosphere, such as a nitrogen gas atmosphere.

The drying process can be performed by lamp annealing. A light source used for the lamp annealing is not particularly limited to a specific light source. For example, an infrared lamp, a xenon lamp, a YAG laser, an argon laser, a carbon dioxide gas laser, and excimer lasers using, for example, XeF, XeCl, XeBr, KrF, KrCl, ArF, and ArCl can be used as the light source. The light sources having an output range of 10 W to 5000 W are generally used. However, one in a range of 100 W to 1000 W is preferable for this embodiment.

An ink material containing Ni (nickel), serving as the conductive minute particles, and water or diethanolamine, serving as a solvent (a dispersion medium), is used to form the base layers of the source electrode 18, the drain electrode 19, and the auxiliary conductive films 35 and 36. At the time when the ink material is discharged, if the surfaces of the banks 41 have a lyophobic property and the bottoms of the openings exposed from the surface of the substrate have a lyophilic property, some of the liquid droplets discharged on the banks 41 are repelled from the surfaces of the banks to flow into the openings.

After the ink material is discharged, a drying process is performed, if necessary, to remove the dispersion medium. The drying process may be performed by heating the substrate P using, for example, a normal hot plate or an electric furnace. The drying process is performed under the conditions of, for example, a heating temperature of 180° C. and a heating time of about sixty minutes. The heating is not necessarily performed under atmosphere, such as a nitrogen gas atmosphere.

The drying process can be performed by lamp annealing. A light source used for the lamp annealing is the same as described above. At the time of heating, a light source having an output range of 100 W to 1000 W can be used.

An ink material containing Ag (silver), serving as the conductive minute particles, and diethylene glycol diethylether, serving as a solvent (a dispersion medium) is used to form the covering layers of the source electrode 18, the drain electrode 19, and the auxiliary conductive films 35 and 36. At the time when the ink material is discharged, if the surfaces of the banks 41 have a lyophobic property, some of the liquid droplets discharged on the banks 41 are repelled from the surfaces of the banks to flow into the openings.

After the ink material is discharged, a drying process is performed, if necessary, to remove the dispersion medium. The drying process may be performed by heating the substrate P using, for example, a normal hot plate or an electric furnace. The drying process is performed under the conditions of, for example, a heating temperature of 180° C. and a heating time of about sixty minutes. The heating is not necessarily performed under atmosphere, such as a nitrogen gas atmosphere.

The drying process can be performed by lamp annealing. A light source used for the lamp annealing is the same as described above. At the time of heating, a light source having an output range of 100 W to 1000 W can be used.

Subsequently, a baking process (a thermal treatment and/or an optical treatment) is performed on the dried films of the source electrode 18, the drain electrode 19, and the auxiliary conductive films 35 and 36.

When a coating agent, such as an organic material, is coated on the surfaces of the conductive minute particles in order to improve electrical contact between the minute particles, to completely remove the dispersion medium, and to improve the dispersibility of the solution, the baking process is performed to remove the coating agent.

The heat treatment and/or the optical treatment are normally carried out in atmosphere, but they may be performed in an inert gas atmosphere, such as nitrogen, argon, or helium, if necessary. The treatment temperature of the heat treatment and/or the optical treatment is correspondingly determined by taking into account, for example, the boiling point (vapor pressure) of the diffusion medium, the type and pressure of the atmosphere gas, the thermal characteristics, such as dispersibility and oxidization, of the minute particles, the presence or absence of the coating material and the amount thereof if present, and the heat resistance temperature of the substrate.

Further, in this embodiment, the laminated structure of the source electrode 18 and the drain electrode 19 is formed of the above-mentioned metallic material, which makes it possible to perform this baking process at a heating temperature of 250° C. or less. That is, it is possible to form an electrode member having good conductivity at a heating temperature of 250° C. or less. Thus, it is possible to effectively prevent a lowering in the mobility of carriers and an increase in the ON resistance of the TFT 10 due to hydrogen desorption in the semiconductor layer 11. As a result, the deterioration of the operational reliability of the formed TFTs is prevented.

In this way, electrical contact between the minute particles in the dried films of the base layer, the covering layer, and the intermediate layer is ensured by the baking process, so that the dried films are converted into conductive films. As a result, the source electrode 18 is formed in the opening 41a of the bank 41, and the source region of the semiconductor layer 11 is electrically connected to the source line 30 through the source electrode 18. In addition, the drain electrode 19 is formed in the opening 41b of the bank 41, and the drain region of the semiconductor layer 11 is electrically connected to the pixel electrode 20 through the drain electrode 19. Further, the auxiliary conductive film 35 is formed in the opening 41c of the bank 41 provided at the intersection of the source line 30 and the gate line 31, and two divided source lines 30 are electrically connected to each other through the auxiliary conductive film 35 (see FIG. 2C). Furthermore, the auxiliary conductive film 36 is formed in the opening 41d of the bank 41 provided at the intersection of the source line 30 and the capacitor line 27, and two divided source lines 30 are electrically connected to each other through the auxiliary conductive film 36.

Further, in this embodiment, the source electrode 18 and the drain electrode 19 each have a three-layer structure of a lower layer (a barrier layer) formed of Ni, an intermediate layer (a base layer) formed of Ag, and an upper layer (a covering layer) formed of Ni. However, the barrier layer may be formed of metallic materials, such as Ti, W, and Mn, other than Ni, or alloys thereof. The base layer may be formed of metallic materials, such as Cu and Al, other than Ag, or alloys thereof. The covering layer may be formed of metallic materials, such as Ti, W, and Mn, other than Ni, or alloys thereof. In addition, the structure of the source electrode 18 and the drain electrode 19 is not limited to the three-layer structure. Further, the baking process may be performed on every laminated film.

Similarly, the auxiliary conductive films 35 and 36 each have a two-layer structure of a lower layer (a base layer) formed of Ag and an upper layer (a covering layer) formed of Ni. However, the base layer may be formed of metallic materials, such as Cu and Al, other than Ag, or alloys thereof, and the covering layer may be formed of metallic materials, such as Ti, W, and Mn, other than Ni, or alloys thereof. In addition, the structure of the auxiliary conductive films 35 and 36 is not limited to the two-layer structure. Further, the baking process may be performed on every laminated film.

An active matrix substrate having the pixel electrodes 20, and the TFTs 10 and the capacitors 25 corresponding to the pixel electrodes 20 formed thereon is completed by the above-mentioned processes.

According to the manufacturing method according to this embodiment, the pixel electrodes 20, the capacitors 25, the gate electrodes 16, the source lines 30, and the gate lines 31 can be formed without being affected by thermal restrictions of the semiconductor layer 11 before the semiconductor layer 11 of each TFT 10 is formed.

In particular, in the manufacturing method of this embodiment, since the materials forming the above-mentioned components are arranged by using the liquid phase method (the liquid droplet discharging method), it is possible to achieve a simplified manufacturing process, to reduce the amount of materials used, and to reduce the manufacturing costs.

Further, if components can be formed of various types of materials or by various types of devices, it is possible to improve the performance of a pixel structure including the components.

Furthermore, the manufacturing method of this embodiment has a common process to the formation of the partition members, the arrangement of the material, and the thermal treatment on the material film when forming the components, which makes it possible to reduce the number of manufacturing processes.

Moreover, in the manufacturing method of this embodiment, the number of times the photolithography technique is performed is reduced. That is, the photolithography technique is performed on only the process for forming the banks 40 of the first layer L1, the process for patterning the semiconductor layer 11, and the process for forming the banks 41 on the first layer L1, that is, three times.

Further, according to the manufacturing method of this embodiment, since the thermal treatment is performed at a temperature of 250° C. or less after the semiconductor layer 11 is formed, it is possible to effectively prevent hydrogen desorption in the semiconductor layer 11. As a result, it is possible to prevent an increase in the ON resistance and lowering in the mobility of carriers, and thus to obtain the TFT 10 having high operational reliability and an active matrix substrate having high reliability.

Figure 16:
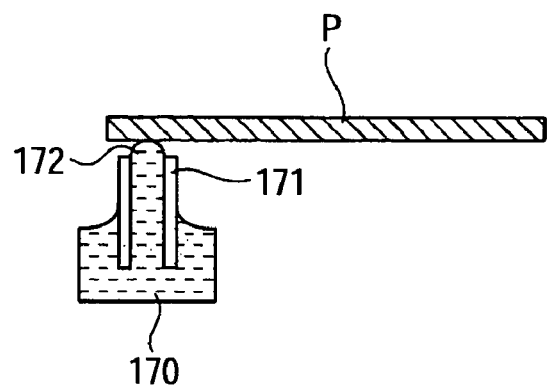
FIG. 16 is a cross-sectional view schematically illustrating a Cap coating method.

In this embodiment, a liquid droplet discharging method using a liquid droplet discharging device is employed to discharge liquid droplets (liquid material). However, for example, a Cap coating method shown in FIG. 16 may be employed to discharge liquid droplets. The cap coating method is a method of forming a film using a capillary phenomenon. In the Cap coating method, a slit 171 is vertically put into a coating solution 170, and the level of the coating solution is raised in this state. Then, a liquid droplet is formed at the top of the slit 171, and the substrate P is horizontally moved in a predetermined direction while being contacted with the liquid droplet 172. In this way, the coating solution 170 can be applied on the surface of the substrate P.

In this embodiment, the pixel electrodes 20 and the capacitor lines 27 are formed by the liquid phase method (the liquid droplet discharging method). However, the electrodes 20 and the capacitor lines 27 may be formed by other methods, such as a vapor deposition method (including a CVD method) and a sputtering method. Alternatively, the electrodes 20 and the capacitor lines 27 may be formed by a combination of the vapor deposition method (including a CVD method), the sputtering method, and the liquid phase method.

In this case, for example, a transmissive conductive film is formed on the entire surface of the substrate P by using the vapor deposition method (including a CVD method) or the sputtering method, and the film is patterned to form the pixel electrodes 20 and the capacitor lines 27 having predetermined shapes. Then, partition members (banks) for arranging materials forming other films (for example, the gate electrodes 16, the source lines 30, and the gate lines 31) are formed on the substrate.

In the manufacturing method of this embodiment, since the pixel electrodes 20 and the capacitor lines 27 are formed in the first layer on the substrate P, these films can be easily formed.

Further, in the above-mentioned embodiment, the banks are formed on the substrate as partition members (dividing members) for partitioning materials forming the components in the liquid phase method. However, regions having a lyophobic property with respect to the materials may be formed on the substrate as the partition members. The regions having a lyophobic property can be formed by a method of performing plasma processing, a method of forming a self-assembled monolayer on the surface of the substrate, or a method of applying a polymer compound having a lyophobic property on the surface of the substrate P. Any lyophobic treatment can give high repellency to the surface of the substrate P.

In the self-assembled monolayer forming method, a self-assembled film composed of an organic molecular film is formed.

The organic molecular film for processing one surface of the substrate includes a functional group which can be coupled to the substrate, a functional group, such as a lyophilic group or a lyophobic group, which is coupled to the other surface of the substrate to reform the property of the substrate (to control surface energy), and a linear carbon chain for binding these functional groups or a carbon chain which is partially branched. The organic molecular film is bonded to the substrate to be self-assembled, thereby forming a molecular layer, for example, a monolayer.

The self-assembled monolayers (SAMs) are films produced by a self-assembly (SA) method which fixes the molecules on a solid surface and is capable of forming a high-orientation and high-density molecular layer. The self-assembly method can manipulate the environmental and geometrical arrangement of a molecule to the order of Angstroms. Furthermore, the self-assembled monolayers are valuable as a technique for fixing organic molecules, the method of manufacturing them is simple, and their thermal stability is high due to the chemical bond between molecules and a substrate. Therefore, it is an important technology for manufacturing molecular devices of the order of Angstroms. Moreover, the self-assembled monolayer is a self assembly process basically, and can form a fine pattern spontaneously. That is, the self-assembled monolayer can form a minute, high-accuracy pattern such as is used in an ultra fine electronic circuit.

For example, fluoroalkylsilane is used as a compound having high orientation. Then, each compound is oriented such that fluoroalkyl group is arranged on the surface of the film, so that a self-assembled film is formed, and the film has a uniform lyophobic property on its surface.

Further, fluoroalkylsilane (hereinafter, referred to as 'FAS'), such as heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydrooctyltriethoxysilane, tridecafluoro-1,1,2,2-tetrahydrooctyltrimethoxysilane, tridecafluoro-1,1,2,2-tetrahydrooctyltrichlorosilane, or trifluoropropyltrimethoxysilane, is given as an example of a compound forming the self-assembled film. At the time of use, a single compound may be used, or a combination of two or more kinds of compounds may be used. The use of FAS makes it possible to obtain a desirable lyophobic property and high adhesion with respect to the substrate.

The FAS is generally expressed by the structural formula $R_n SiX_{(4-n)}$, where n is an integer between 1 and 3 inclusive, and X is a hydrolytic group, such as a methoxy group, an ethoxy group, or a halogen atom. Furthermore, R is a fluoroalkyl group having a structure of $(CF_3)(CF_2)_x(CH_2)_y$ (where x is an integer between 0 and 10 inclusive, and y is an integer between 0 and 4 inclusive). When a plurality of Rs or Xs are combined with Si, the Rs or Xs may be equal to each other, or they may differ from each other. The hydrolytic group which is expressed by X forms silanol by hydrolysis, and reacts with a hydroxyl group of the under-layer of the substrate (glass or silicon) to be bonded to the substrate by siloxane bonding.

Meanwhile, since R has a fluoro group, such as ($CF_3$), on the surface, it makes the surface of the under-layer of the substrate have a lyophobic property (surface energy is low).

In the plasma processing method, plasma is radiated onto the substrate under the atmospheric pressure or vacuum. Gas used for the plasma processing is selected considering, for example, the property of the surface of the substrate. For example, 4-fluoromethane, perfluorohexane, or perfluorodecane can be used as the gas used for the plasma processing.

Further, making the substrate surface lyophobic can be implemented by attaching a film having a predetermined lyophobic property, for example, a polyimide film processed with 4-fluoroethylene, onto the surface of the substrate. Moreover, a polyimide film can be used as a substrate.

If the surface of the substrate has a higher degree of liquid-repellency than a predetermined degree of liquid-repellency, the conditions of the surface of the substrate may be controlled by radiating ultraviolet rays with a wavelength of 170 to 400 nm, or by exposing the substrate in an ozone atmosphere to make the surface of the substrate lyophilic.

Further, the method of manufacturing the active matrix substrate according to this embodiment can be applied to a method of manufacturing various electro-optical devices provided with thin film transistors. The electro-optical devices include, for example, a liquid crystal display device, an organic electroluminescent display, and a plasma display device.

Electronic Apparatus

Figure 17:
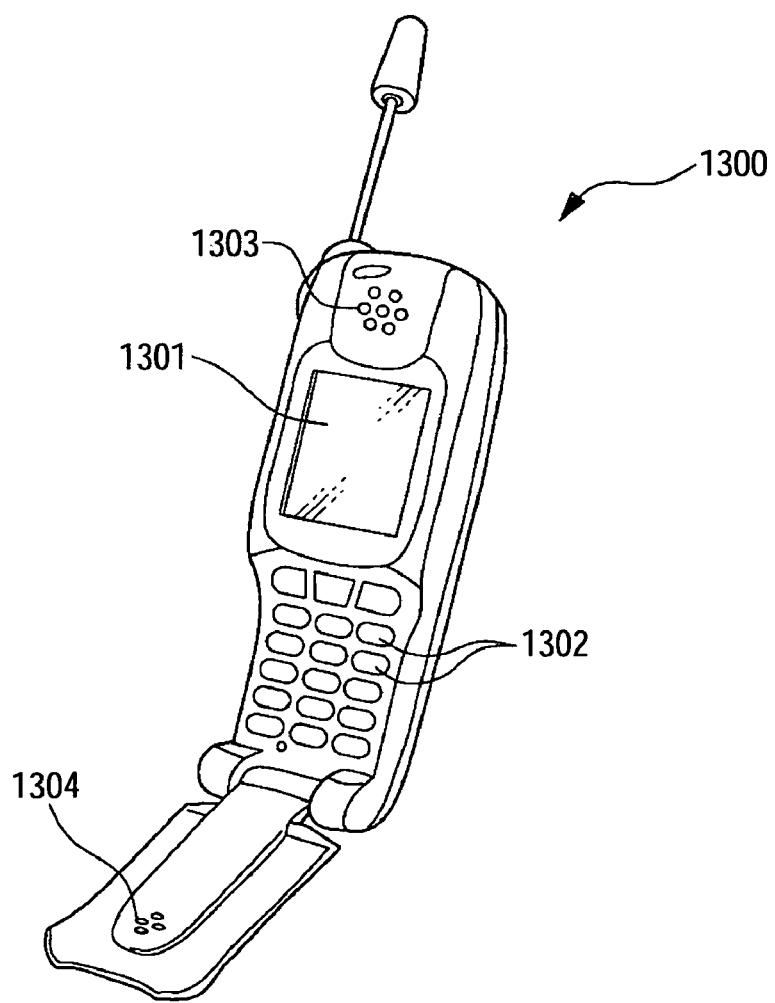
FIG. 17 is a perspective view illustrating an example of an electronic apparatus.

FIG. 17 is a perspective view illustrating an example of an electronic apparatus according to the invention.

A mobile phone 1300 shown in FIG. 17 includes a small display unit 1301, which is the liquid crystal display device according to the invention, a plurality of operating buttons 1302, an ear piece 1303, and a mouth piece 1304.

The electro-optical device according to the above-described embodiment can be uses as image display units of various electronic apparatuses, such as an electronic book, a personal computer, a digital, still camera, an image monitor, a viewfinder-type or monitor-direct-view-type videotape recorder, a car navigation system, a pager, an electronic organizer, an electronic calculator, a word processor, a workstation, a television phone, a POS terminal, and apparatuses equipped with touch panels, in addition to the mobile phone. These electronic apparatuses equipped with the electro-optical device according to the invention are inexpensive and have high reliability.

The preferred embodiments of the invention have been described above with reference to the accompanying drawings, but the invention is not limited thereto. It will be understood that various changes and modifications can be made without departing from the spirit and scope of the invention, and that the modifications and the changes are also included in the technical scope of the invention.

What is claimed is:

1. A pixel structure comprising:
   pixel electrodes; and
   switching elements which correspond to the pixel electrodes,
   wherein the pixel electrodes and the switching elements are formed on the same substrate,
   each pixel electrode is provided in a layer on the substrate, not on a semiconductor layer of the switching element; and
   an insulating film formed on the substrate that includes a plurality of openings, the pixel electrodes and the switching elements being formed in respective ones of the plurality of openings.

2. The pixel structure according to claim 1,
   wherein the pixel electrodes are provided in a first layer on the substrate.

3. The pixel structure according to claim 1, further comprising:
   capacitors which correspond to the pixel electrodes,
   wherein the pixel electrodes and conductive lines constituting the capacitors are provided in the same layer on the substrate.

4. The pixel structure according to claim 3,
   wherein the pixel electrodes and the conductive lines of the capacitors include the same material film.

5. The pixel structure according to claim 3, further comprising:
   auxiliary electrodes each of which is electrically connected to the pixel electrode and covers the conductive line of the capacitor with the insulating film interposed therebetween.

6. The pixel structure according to claim 5,
   wherein the pixel electrodes, the conductive lines of the capacitors, the auxiliary electrodes, and the insulating films are composed of transmissive films.

7. The pixel structure according to claim 3, further comprising:
   banks which are formed on the substrate to partition at least one of the pixel electrodes and the capacitors.

8. The pixel structure according to claim 1,
   wherein the switching elements are thin film transistors, and
   gate electrodes of the switching elements and the pixel electrodes are provided in the same layer on the substrate.

9. The pixel structure according to claim 8,
   wherein banks for partitioning the pixel electrodes and/or the gate electrodes are formed on the substrate.

10. The pixel structure according to claim 8,
    wherein gate lines, source lines, and the pixel electrodes are provided in the same layer on the substrate.

11. The pixel structure according to claim 10,
    wherein the gate electrodes, the gate lines, and the source lines include the same material film.

12. The pixel structure according to claim 10,
    wherein banks for partitioning the gate lines and/or the sources lines are formed on the substrate.

13. An active matrix substrate comprising the pixel structure according to claim 1.

14. An electro-optical device comprising the active matrix substrate according to claim 13.

15. An electronic apparatus comprising the electro-optical device according to claim 14.

* * * * *